(12) United States Patent
Ku et al.

(10) Patent No.: US 12,283,439 B2
(45) Date of Patent: Apr. 22, 2025

(54) ILLUMINATED KEYSWITCH STRUCTURE

(71) Applicants: DARFON ELECTRONICS (HUAIAN) CO., LTD., Jiangsu (CN); DARFON ELECTRONICS CORP., Taoyuan (TW)

(72) Inventors: Shih-Yung Ku, Taoyuan (TW); Wen-Ming Hsu, Taoyuan (TW); Yu-Chuan Ku, Taoyuan (TW)

(73) Assignees: DARFON ELECTRONICS (HUAIAN) CO., LTD., Jiangsu (CN); DARFON ELECTRONICS CORP., Taoyuan (TW)

( * ) Notice: Subject to any disclaimer, the term of this patent is extended or adjusted under 35 U.S.C. 154(b) by 35 days.

(21) Appl. No.: 18/242,013

(22) Filed: Sep. 5, 2023

(65) Prior Publication Data

US 2023/0420197 A1 Dec. 28, 2023

Related U.S. Application Data

(63) Continuation-in-part of application No. 18/098,675, filed on Jan. 18, 2023, which is a continuation-in-part
(Continued)

(30) Foreign Application Priority Data

May 27, 2021 (CN) .......................... 202110583485.1
Dec. 21, 2022 (TW) .................................. 111149169
May 5, 2023 (TW) .................................. 112204358

(51) Int. Cl.
*H01H 13/02* (2006.01)

(52) U.S. Cl.
CPC ..... *H01H 13/023* (2013.01); *H01H 2013/026* (2013.01); *H01H 2219/04* (2013.01); *H01H 2219/048* (2013.01)

(58) Field of Classification Search
CPC .................................................. H01H 13/023
See application file for complete search history.

(56) References Cited

U.S. PATENT DOCUMENTS 6,790,003 B1 9/2004 Hu
2009/0067153 A1 3/2009 Takeda
(Continued)

FOREIGN PATENT DOCUMENTS

CN 201673831 U 12/2010
CN 201812704 U 4/2011
(Continued)

*Primary Examiner* — Christopher E Dunay
(74) *Attorney, Agent, or Firm* — Winston Hsu

(57) ABSTRACT

An illuminated keyswitch structure includes a base plate, a keycap, and a light-emitting die package. The light-emitting die package is disposed to illuminate the keycap through the base plate. The light-emitting die package comprises a warm color temperature light-emitting die and a cold color temperature light-emitting die, and the light-emitting die package extends along an arrangement direction. Each of the two light-emitting dies has a short side arranged adjacent to each other, with a long side of each of the two light-emitting dies facing a same direction and configured proximate to each other. A gap between the two adjacent short sides of the two light-emitting dies is not greater than either one of the two adjacent short sides of the two light-emitting dies.

20 Claims, 31 Drawing Sheets

Related U.S. Application Data of application No. 17/909,991, filed as application No. PCT/CN2022/095234 on May 26, 2022, now Pat. No. 12,198,873.

(60) Provisional application No. 63/339,978, filed on May 10, 2022.

(56) References Cited

U.S. PATENT DOCUMENTS

| | | | |
|---|---|---|---|
| 2019/0066947 | A1 | 2/2019 | Chiu |
| 2019/0339788 | A1 | 11/2019 | Yang |
| 2021/0358699 | A1 | 11/2021 | Ruff |
| 2024/0036245 | A1* | 2/2024 | Tsai ................... H01H 13/83 |
| 2024/0096567 | A1* | 3/2024 | Chen ................... H01H 13/83 |
| 2024/0112870 | A1* | 4/2024 | Chen ................... H01H 13/83 |
| 2024/0118480 | A1* | 4/2024 | Chen ................... H01H 13/83 |
| 2024/0134112 | A1* | 4/2024 | Chen ................... H01H 13/023 |

FOREIGN PATENT DOCUMENTS

| | | |
|---|---|---|
| CN | 201927524 U | 8/2011 |
| CN | 103218051 A | 7/2013 |
| CN | 203966912 U | 11/2014 |
| CN | 104332340 A | 2/2015 |
| CN | 112673444 A | 4/2021 |
| KR | 10-0752517 | 8/2007 |
| TW | M386540 U1 | 8/2010 |
| TW | M403052 U1 | 5/2011 |
| TW | M410323 U1 | 8/2011 |
| TW | M413165 U1 | 10/2011 |
| TW | M419150 U1 | 12/2011 |
| TW | M443926 U | 12/2012 |
| TW | M448728 U | 3/2013 |
| TW | 201413116 A | 4/2014 |
| TW | M514602 U | 12/2015 |
| TW | M519314 U | 3/2016 |
| TW | M538231 U | 3/2017 |
| TW | I603357 B | 10/2017 |
| TW | 201810331 A | 3/2018 |
| TW | 201816823 A | 5/2018 |
| TW | M569084 U | 10/2018 |
| TW | I642075 B | 11/2018 |
| TW | I648758 B | 1/2019 |
| TW | 201928207 A | 7/2019 |
| TW | 202029526 A | 8/2020 |
| TW | 202209376 A | 3/2022 |

\* cited by examiner

ILLUMINATED KEYSWITCH STRUCTURE

CROSS REFERENCE TO RELATED APPLICATIONS

This application is a continuation-in-part of U.S. application Ser. No. 18/098,675, filed on Jan. 18, 2023, which claims the benefit of U.S. Provisional Application No. 63/339,978, filed on May 10, 2022, and is a continuation-in-part of U.S. application Ser. No. 17/909,991, filed on Sep. 8, 2022. The contents of these applications are incorporated herein by reference.

BACKGROUND OF THE INVENTION

1. Field of the Invention

The present invention relates to a keyswitch structure, and more particularly to an illuminated keyswitch structure.

2. Description of the Prior Art

One-to-one illuminated keys are usually provided with a light source under each keycap. The light source is used to emit light to form a backlight. When the keycap has a permeable area corresponding to characters such as letters or symbols, the corresponding light source that is usually disposed opposite to the characters emits light toward the characters. In actual products, there are often other components between the light source and the permeable area of the keycap, such as supports, base plate, circuit board, etc., which interfere with the light transmission path and cause uneven color of the characters on the keycap. In the case where the light source can emit light of multiple colors, the problem of serious color deviation also occurs.

SUMMARY OF THE INVENTION

In view of the problems in the prior art, an objective of the invention is to provide an illuminated keyswitch structure, which uses a light-emitting die package having a plurality of light-emitting dies so that light emitted by each light-emitting dies can travel in a similar path.

An illuminated keyswitch structure of an embodiment according to the invention includes a base plate, a keycap, and a light-emitting die package. The keycap is movably disposed above the base plate in a vertical direction. The light-emitting die package is disposed to illuminating the keycap through the base plate. The light-emitting die package comprises a warm color temperature light-emitting die and a cold color temperature light-emitting die, and the light-emitting die package extends along an arrangement direction; wherein each of the two light-emitting dies has a short side arranged adjacent to each other, with a long side of each of the two light-emitting dies facing a same direction and configured proximate to each other; wherein a gap between the two adjacent short sides of the two light-emitting dies is not greater than either one of the two adjacent short sides of the two light-emitting dies.

In an embodiment of the illuminated keyswitch structure, light-emitting die package comprises a translucent package material that covers the two light-emitting dies.

In an embodiment of the illuminated keyswitch structure, the two adjacent long sides of the two light-emitting dies are arranged in parallel to a long side of the light-emitting die package.

In an embodiment of the illuminated keyswitch structure, the light-emitting die package comprises a carrier, the carrier has side walls to form an accommodating space, and the two light-emitting dies are accommodated in the accommodating space.

In an embodiment of the illuminated keyswitch structure, the warm color temperature light-emitting die is a white light-emitting die at least partially produces yellow light, and the cold color temperature light-emitting die is another white light-emitting die at least partially produces blue light.

In an alternative embodiment, the illuminated keyswitch structure further comprises a switch circuit board that is light-transmitting and disposed above the light-emitting die package, wherein the switch circuit board comprises a permeable carrying plate structure and circuitry carried on the permeable carrying plate structure, and the switch circuit board and the light-emitting die package do not overlap in the vertical direction.

In an alternative embodiment, the illuminated keyswitch structure further comprises a switch circuit board that is light-transmitting and disposed above the light-emitting die package, wherein the switch circuit board comprises a switch contact pad, the switch contact pad has a flat edge, and the two adjacent light-emitting dies are arranged adjacent to and parallel to the flat edge.

In an alternative embodiment, the illuminated keyswitch structure further comprises a first support and a second support which are pivotally connected with each other, wherein each of the two adjacent light-emitting dies does not overlap with a gap projection of the first support and the second support in the vertical direction.

In an alternative embodiment, the illuminated keyswitch structure further comprises a switch circuit board, wherein the switch circuit board and the base plate are stacked, the switch circuit board is disposed above the light-emitting die package, the base plate a through hole, the switch circuit board comprises a switch contact pad, and vertical projections of the switch contact pad and the light-emitting die package on the base plate fall within the through hole.

In an alternative embodiment of the illuminated keyswitch structure, the through hole comprises a main hole portion and an extension portion extending from a side of the main hole portion, the vertical projection of the switch contact pad on the base plate falls within the main hole portion, and the vertical projection of the light-emitting die package on the base plate falls within the extension portion.

In an alternative embodiment, the illuminated keyswitch structure further comprises a switch circuit board that is light-transmitting, wherein the switch circuit board and the base plate are stacked, the switch circuit board is disposed above the light-emitting die package, the base plate has a through hole, the switch circuit board comprises a switch contact pad, a vertical projection of the light-emitting die package on the base plate falls within the through hole, and a vertical projection of the switch contact pad on the base plate is located outside the through hole.

In an alternative embodiment, the illuminated keyswitch structure further comprises a switch circuit board that is light-transmitting, wherein the switch circuit board and the base plate are stacked, the switch circuit board is disposed above the light-emitting die package, the switch circuit board a trace segment extending straight, and the two adjacent light-emitting dies are arranged adjacent to and parallel to the trace segment.

In an alternative embodiment of the illuminated keyswitch structure, the keycap has a permeable indicator area, the permeable indicator area has a lengthwise direction perpendicular to the arrangement direction of the light-emitting die package, the permeable indicator area comprises a plurality of permeable characters arranged along the lengthwise direction, and the permeable indicator area and the light-emitting die package at least partially overlap in the arrangement direction.

In an alternative embodiment of the illuminated keyswitch structure, the keycap has a permeable indicator area, the permeable indicator area has a lengthwise direction, and the two adjacent light-emitting dies have edges perpendicular to the lengthwise direction.

In an alternative embodiment, the illuminated keyswitch structure further comprises a light-guiding sheet that is disposed under the base plate, wherein the light-guiding sheet has an accommodating recess, the light-emitting die package is located in the accommodating recess, and light emitted by the light-emitting die package enters the light-guiding sheet from an inner wall surface of the accommodating recess.

In an alternative embodiment, the illuminated keyswitch structure further comprises a mask layer that is disposed directly above the light-emitting die package and covers the light-emitting die package.

In an alternative embodiment, the illuminated keyswitch structure further comprises a mask layer that covers the light-emitting die package, wherein the mask layer has at least one permeable area disposed on a periphery of a projection of the light-emitting die package on the mask layer.

In an alternative embodiment of the illuminated keyswitch structure, the base plate has a through hole, and a vertical projection of the permeable area on the base plate falls within the through hole.

In an alternative embodiment of the illuminated keyswitch structure, the base plate has a through hole, and a vertical projection of an impermeable area of the mask layer on the base plate at least partially falls within the through hole.

In an alternative embodiment of the illuminated keyswitch structure, the base plate has a through hole, the through hole has a straight hole edge, the adjacent long sides of the two light-emitting dies are arranged in parallel to the straight hole edge.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
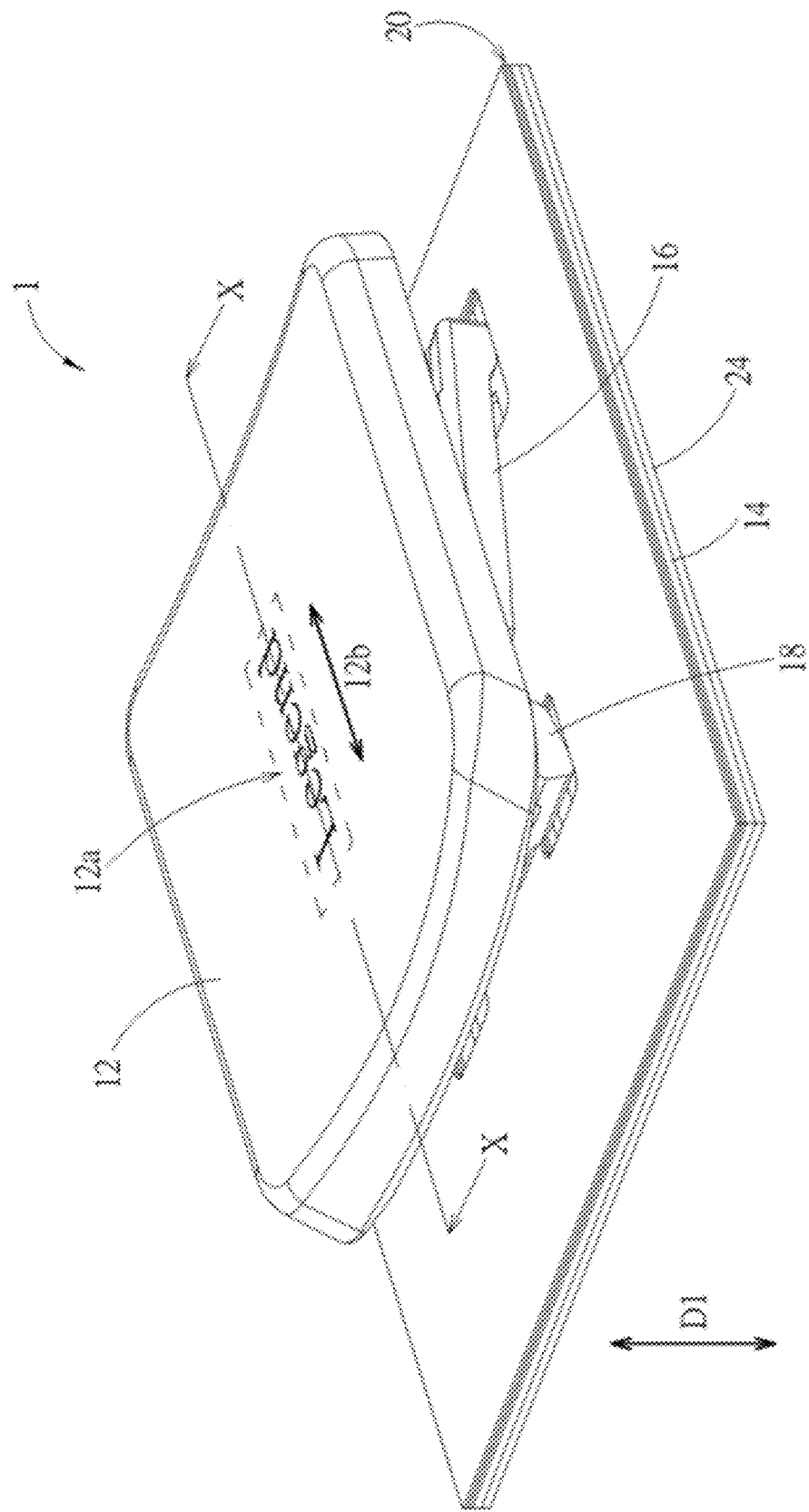
FIG. 1 is a schematic diagram illustrating an illuminated keyswitch structure according to an embodiment.
Figure 2:
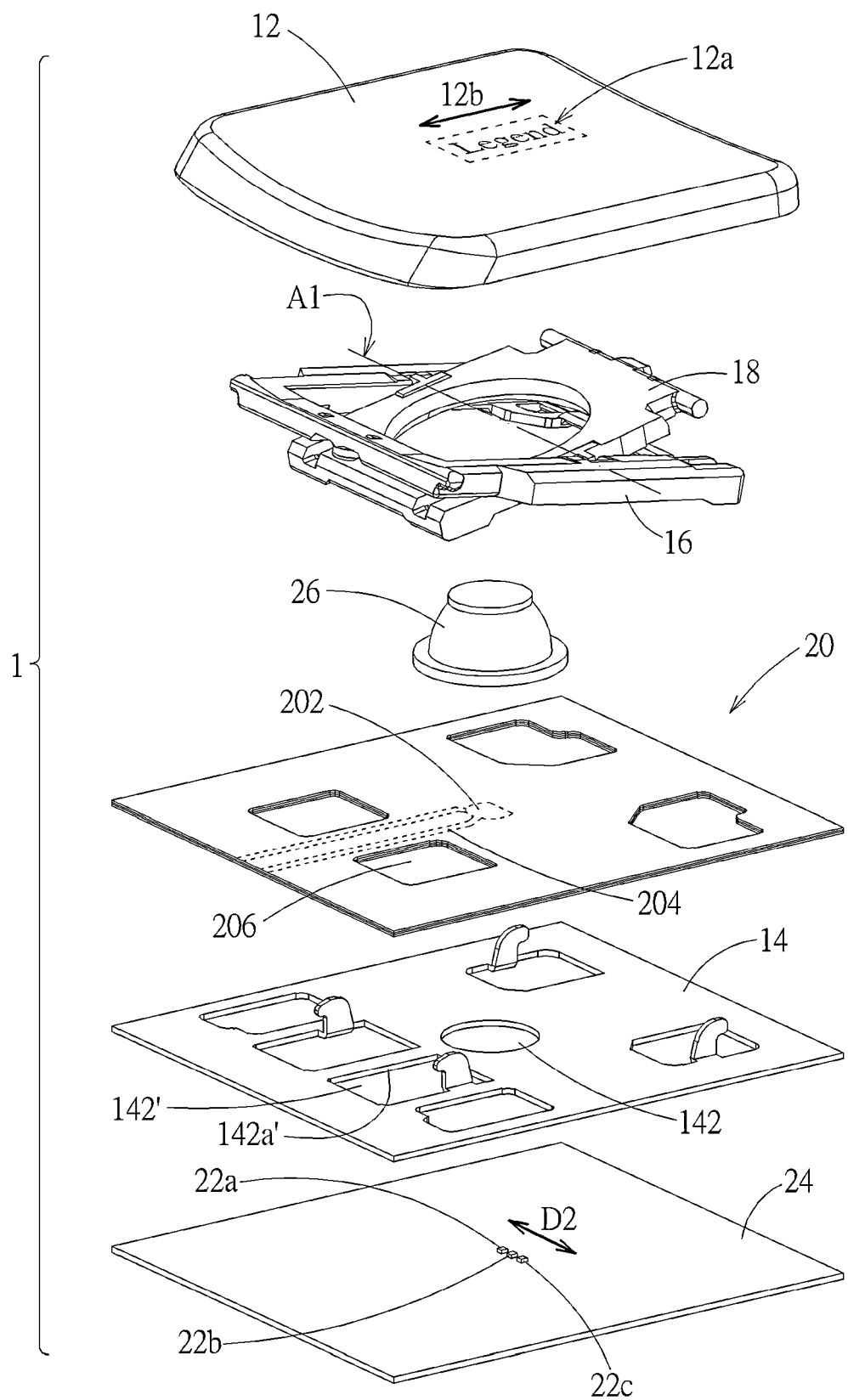
FIG. 2 is an exploded view of the illuminated keyswitch structure in FIG. 1.
Figure 3:
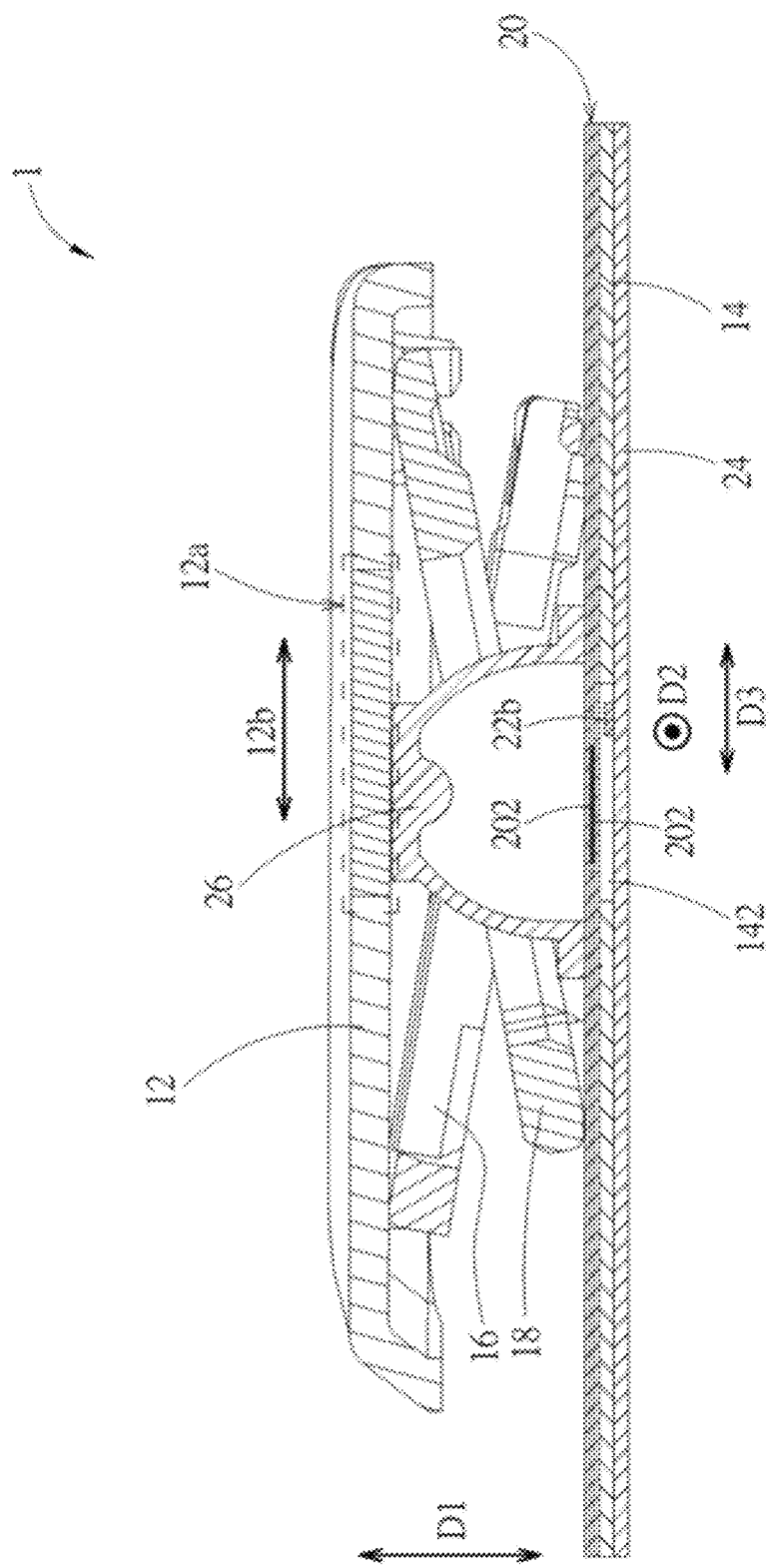
FIG. 3 is a sectional view of the illuminated keyswitch structure along the line X-X in FIG. 1.

Please refer to FIG. 1 to FIG. 3. FIG. 1 is a schematic diagram illustrating an illuminated keyswitch structure according to an embodiment. FIG. 2 is an exploded view of the illuminated keyswitch structure in FIG. 1. FIG. 3 is a sectional view of the illuminated keyswitch structure along the line X-X in FIG. 1. An illuminated keyswitch structure 1 according to an embodiment includes a keycap 12, a base plate 14, a first support 16, a second support 18, a transparent switch circuit board 20, and one or more light-emitting dies (for example, but not limited to, three light-emitting dies 22a, 22b and 22c, the light-emitting dies are used for emitting light of different color lights, such as red light, green light and blue light; besides, the light-emitting dies 22a, 22b and 22c can be realized by, but not limited to, light-emitting diodes). The keycap 12 is disposed above the base plate 14. Both the first support 16 and the second support 18 are connected to and between the keycap 12 and the base plate 14 to support the keycap 12 so that the keycap 12 is movable in a vertical direction D1 (indicated by a double-headed arrow in FIG. 1 and FIG. 3) through the first support 16 and the second support 18. The switch circuit board 20 is placed on the base plate 14 (i.e., under the keycap 12). The light-emitting dies 22a, 22b and 22c are disposed under the switch circuit board 20, e.g., fixed on a light source circuit board 24 (the light source circuit board 24 is, for example, but not limited to, a flexible printed circuit board) disposed under the base plate 14. The base plate 14 forms a corresponding through hole 142 to expose the light-emitting dies 22a, 22b and 22c; in practice, the light-emitting dies 22a, 22b and 22c can partially or fully enter the through hole 142. Please refer to FIG. 1 and FIG. 3. The light-emitting dies 22a, 22b and 22c are not higher than the base plate 14. The light-emitting dies 22a, 22b and 22c are located within a projection of the through hole 142 in the vertical direction D1. The circuitry of the switch circuit board 20 (which is partially shown in dashed lines in FIG. 2) does not cover the light-emitting dies 22a, 22b and 22c, so that light emitted upward by the light-emitting dies 22a, 22b and 22c can pass through the switch circuit board 20 to illuminate the keycap 12.

In the embodiment, the switch circuit board 20 may be realized by a membrane circuit board, which is usually formed by stacking three layers of transparent sheets, in which the required circuitry is formed on the upper and lower transparent sheets, and the middle transparent sheet provides the insulation for the circuitry. The circuitry of the switch circuit board 20 includes switch contact pads 202 and several trace segments (the hidden profiles of which are shown in dotted lines in FIG. 2). The illuminated keyswitch structure 1 uses a preamble resilient dome 26 as a returning part. The resilient dome 26 aligns with the switch contact pads 202. The resilient dome 26 is disposed on the switch circuit board 20 and covers the switch contact pads 202 and the light-emitting dies 22a, 22b and 22c in the vertical direction D1. The keycap 12 can be pressed (e.g., by a finger of a user) to squeeze the resilient dome 26 downward, thereby triggering the switch contact pads 202. After the external force applied to the keycap 12 is removed (e.g., the user removes his finger from the keycap 12), the squeezed resilient dome 26 can be restored to push the keycap 12 upwards back to its original position.

Figure 4A:
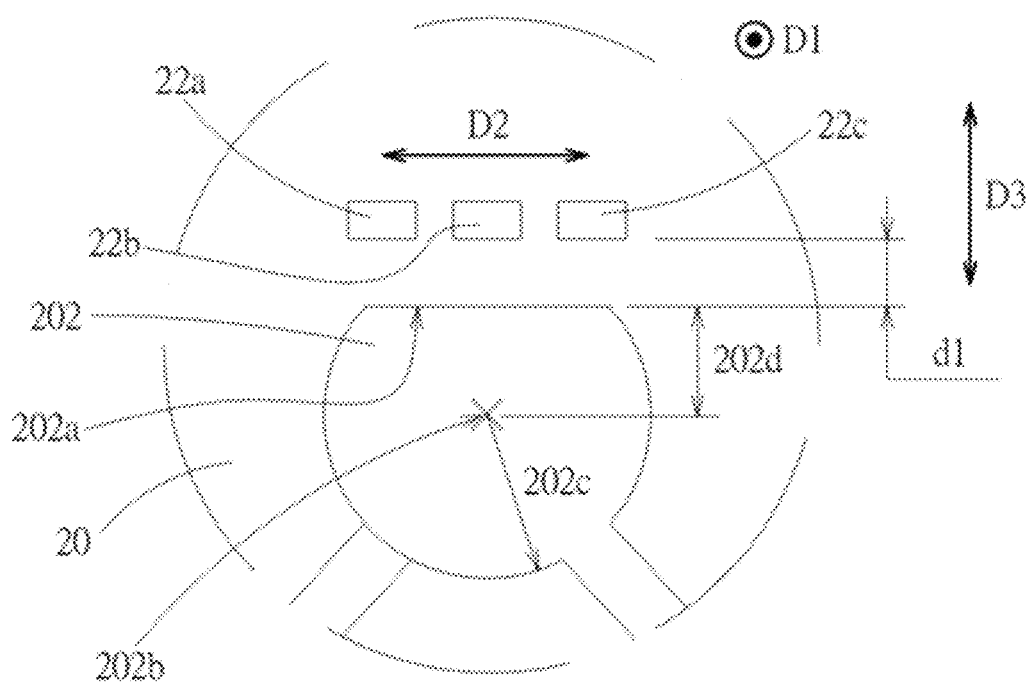
FIG. 4A is a schematic diagram illustrating a top view configuration of a switch circuit board and light-emitting dies.

Please also refer to FIG. 4A. FIG. 4A is a schematic diagram illustrating a top view configuration of a portion of the switch circuit board and light-emitting dies of the illuminated keyswitch structure in FIG. 2. Therein, the circuitry of the switch circuit board 20 and the hidden profiles of the light-emitting dies 22a, 22b and 22c are shown in solid lines. The switch contact pad 202 has a non-circular profile, e.g., but not limited to, a cut-flat circular profile with a flat edge 202a. The light-emitting dies 22a, 22b and 22c are arranged in an arrangement direction D2 (indicated by a double-headed arrow in FIG. 4A). The arrangement direction D2 is parallel to the flat edge 202a. There is a light-emitting distance d1 in a horizontal direction D3 (indicated by a double-headed arrow in the figures) between the light-emitting dies 22a, 22b and 22c and the switch contact pad 202 (that is, the distance from the projection of the whole profiles of the light-emitting areas of the light-emitting dies 22a, 22b and 22c on the switch circuit board 20 to the flat edge 202a). In principle, the farther the light-emitting dies 22a, 22b and 22c are away from the switch contact pads 202, the more the situation that the switch contact pads 202 shields the light emitted by the light-emitting dies 22a, 22b and 22c can be reduced. In practice, the light-emitting distance d1 can be designed to be between 0.3 mm and 0.5 mm. Furthermore, in the embodiment, the cut-flat circular profile has a center 202b and a radius 202c. A ratio of a distance 202d from the center 202b to the flat edge 202a to the radius 202c is greater than 0.5. In principle, the switch contact pads 202 can maintain acceptable contact conduction characteristics.

Figure 4B:
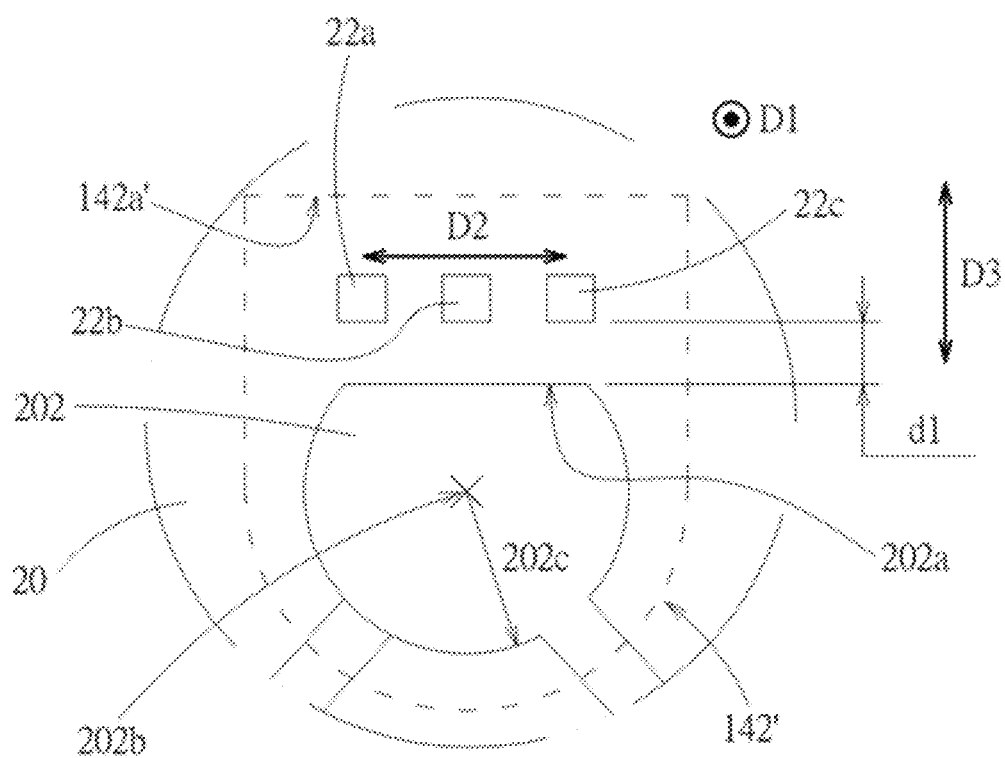
FIG. 4B is a schematic diagram illustrating a top view configuration of another embodiment extended from FIG. 4A.
Figure 4C:
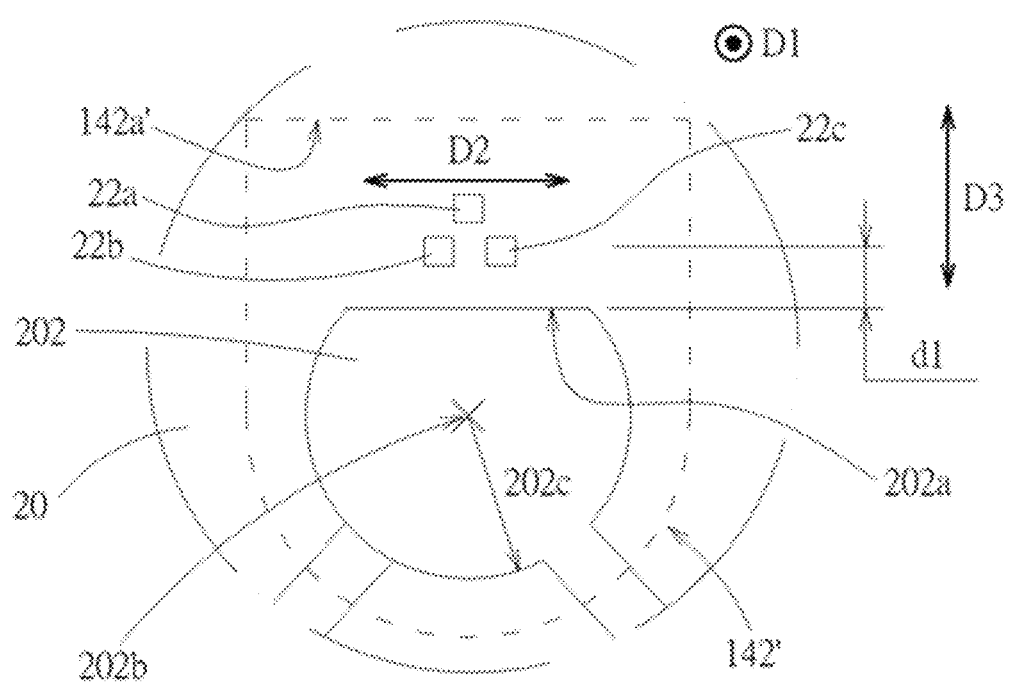
FIG. 4C is a schematic diagram illustrating a top view configuration of another embodiment extended from FIG. 4A.

Please refer to FIG. 4B and FIG. 4C. Each of FIG. 4B and FIG. 4C is a schematic diagram illustrating a top view configuration of another embodiment extended form FIG. 4A. A portion of the arc edge of the through hole 142' of the base plate 14 (whose profile projection is shown in dashed lines in the figures) is parallel to the arc edge of the switch contact pad 202, and the other side of the through hole 142' consists of three mutually perpendicular edges, which form a bullet-shaped through hole 142' as a whole. In FIG. 4B, the light-emitting dies 22a, 22b and 22c are all arranged in the arrangement direction D2. The light-emitting dies 22a, 22b and 22c are not only adjacent to the flat edge 202a of the switch contact pad 202, but also adjacent to a straight hole edge 142a' of the through hole 142' of the base plate 14. In this case, the suitable configuration is that the arrangement direction D2 for the light-emitting dies 22a, 22b and 22c is parallel (or roughly parallel) to the hole edge 142a' of the through hole 142' of the base plate 14, and also parallel (or roughly parallel) to the flat edge 202a of the switch contact pad 202. In FIG. 4C, the light-emitting dies 22a, 22b and 22c are arranged in a triangle. The light-emitting die 22a is toward the straight hole edge 142a' of the through hole 142' of the base plate 14. The light-emitting die 22c is not located within a union range of the light-emitting dies 22a and 22b. The light-emitting dies 22b and 22c are arranged straight in the arrangement direction D2 with edges parallel to each other. In this case, the arrangement direction of the at least two light-emitting dies 22b and 22c is parallel (or roughly parallel) to the straight hole edge 142a' of the through hole 142' of the base plate 14, and also parallel (or roughly parallel) to the flat edge 202a of the switch contact pad 202. However, it is not limited thereto in practice. For example, the at least two light-emitting dies 22b and 22c may be arranged in the horizontal direction D3, so that the arrangement direction of the at least two light-emitting dies 22b and 22c is perpendicular (or roughly perpendicular) to the straight hole edge 142a' of the through hole 142' of the base plate 14, and also perpendicular (or roughly perpendicular) to the flat edge 202a of the switch contact pad 202, but parallel to the horizontal direction D3. In another embodiment, in the bullet-shaped through hole 142' of the base plate 14 in FIG. 4B and FIG. 4C, the three mutually perpendicular edges can be reduced as needed, and become a key-shaped through hole 142' with an arc end portion and a narrow and long end portion. In this case, all or at least two of the light-emitting dies 22a, 22b and 22 may be arranged in a straight line perpendicular to the flat edge 202a of the switch contact pad 202 and the hole edge 142a' at the end.

The hole edge 142a' of the through hole 142' of the base plate 14 and the flat edge 202a of the switch contact pad 202 are both heterochromatic sensitive areas. The heterochromatic sensitive area will cause the problem of uneven light mixing and color deviation. Therefore, the above technical solutions all are to dispose the plurality of light-emitting dies 22a, 22b and 22c at the same side of the heterochromatic sensitive area; that is, the light-emitting dies 22a, 22b and 22c are simultaneously disposed at the same side of the hole edge 142a' of the through hole 142' of the base plate 14, and/or the light-emitting dies 22a, 22b and 22c are simultaneously disposed at the same side of the flat edge 202a of the switch contact pad 202. The distances from the plurality of light-emitting dies 22a, 22b and 22c to the same heterochromatic sensitive area are close to each other. Since the process technology for the light-emitting dies 22a, 22b and 22c has reached the millimeter or even micron level, even if the light-emitting dies 22a, 22b and 22c are not arranged in a straight line, the distances to the same heterochromatic sensitive area are very close to each other. For clear display, the plurality of light-emitting dies in each figure of the present disclosure are drawn in a larger size, and the distances between the plurality of light-emitting dies are relatively large. In actual implementation, the scale of the light-emitting dies is much smaller than that in the figures of the disclosure.

Figure 5:
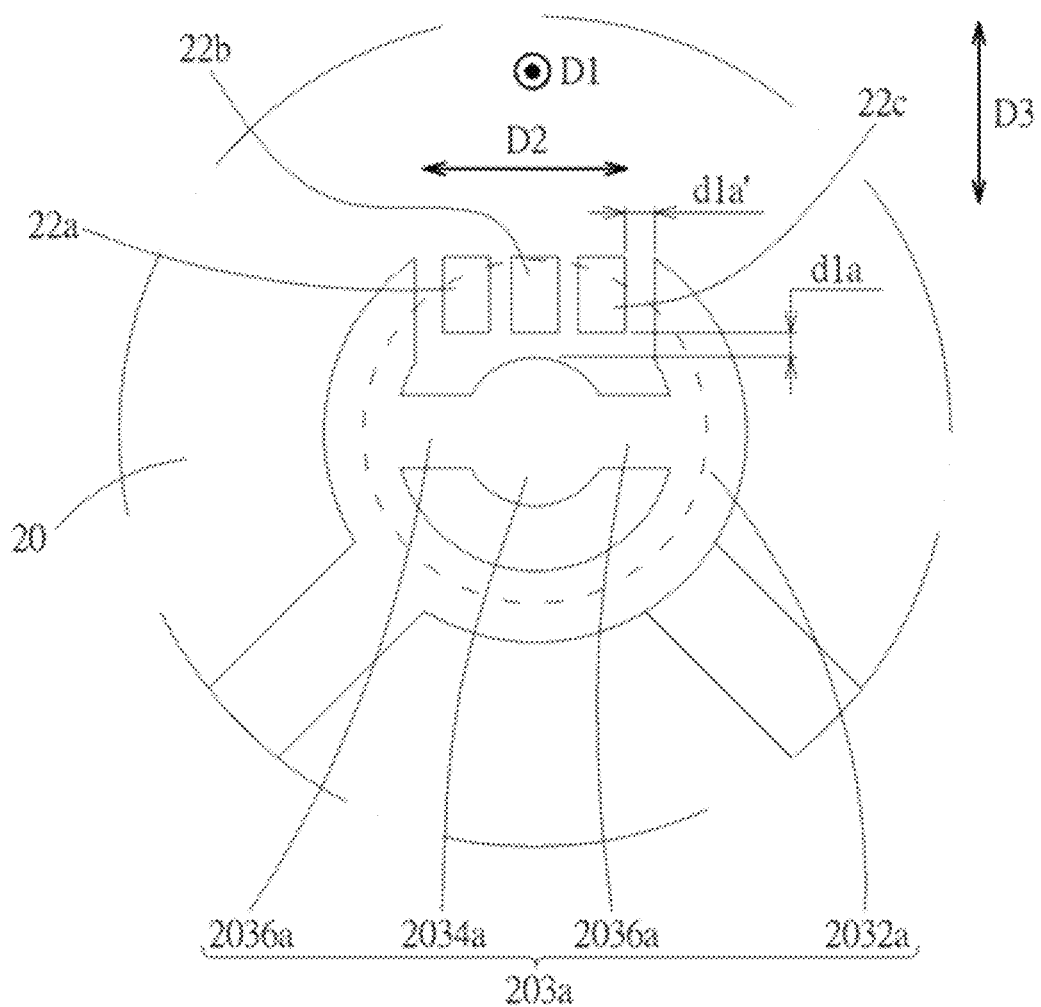
FIG. 5 is a schematic diagram illustrating a top view configuration of the switch circuit board and the light-emitting dies in FIG. 4A according to another embodiment.

In addition, in practice, the switch contact pad of the switch circuit board 20 may have different shapes. For example, as shown by FIG. 5, the switch contact pad 203a according to an embodiment includes a peripheral portion 2032a and a central portion 2034a and two connecting portions 2036a which are located at the inner side the peripheral portion 2032a. The two connecting portions 2036a are located at opposite sides of the central portion 2034a and connect the peripheral portion 2032a and the central portion 2034a. The peripheral portion 2032a extends incompletely along a circular path (indicated by a dashed line in the figure) and is C-shaped. The central portion 2034a has a circular profile. The light-emitting dies 22a, 22b and 22c are located between two ends of the peripheral portion 2032a (i.e., at the opening). The circular path passes through the light-emitting dies 22a, 22b and 22c (i.e., the light-emitting dies 22a, 22b and 22c are arranged on the circular path). The light-emitting dies 22a, 22b and 22c are closer to the central portion 2034a and there is a light-emitting distance d1a between the light-emitting dies 22a, 22b and 22c and the central portion 2034a. Similarly, in practice, the light-emitting distance d1a can be designed to be between 0.3 mm and 0.5 mm. If the light-emitting dies 22a, 22b and 22c are closer to the two ends of the peripheral portion 2032a and there is a light-emitting distance d1a' between the light-emitting dies 22a, 22b and 22c and the peripheral portion 2032a. Similarly, in practice, the light-emitting distance d1a' can also be designed to be between 0.3 mm and 0.5 mm.

Figure 6:
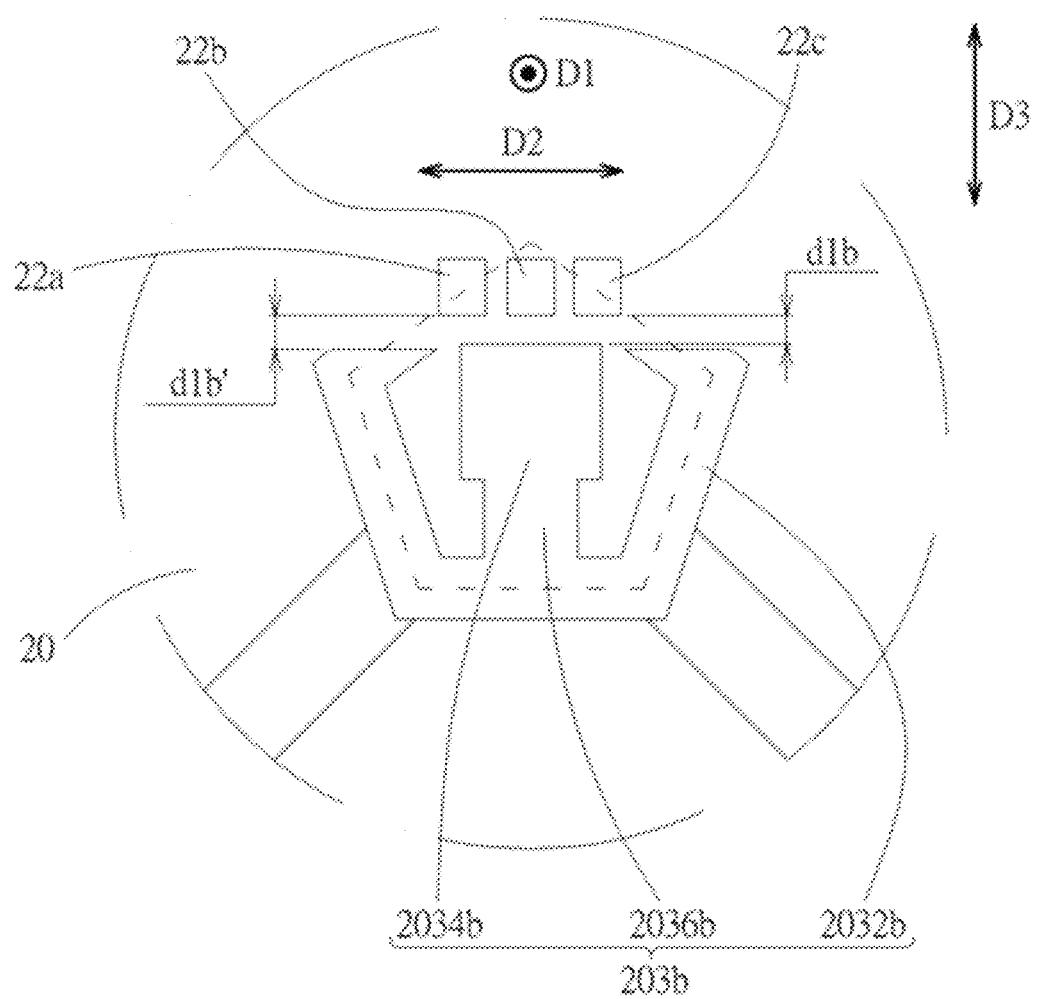
FIG. 6 is a schematic diagram illustrating a top view configuration of the switch circuit board and the light-emitting dies in FIG. 4A according to another embodiment.

For another example, as shown by FIG. 6, the switch contact pad 203b according to an embodiment includes a peripheral portion 2032b and a central portion 2034b and a connecting portion 2036b which are located at the inner side the peripheral portion 2032b. The connecting portion 2036b connects the peripheral portion 2032b and the central portion 2034b. The peripheral portion 2032b extends incompletely along a convex polygonal path (e.g., but not limited to a pentagonal path, indicated by dashed lines in the figure) and is roughly C-shaped. The central portion 2034b has a convex polygonal profile (e.g., but not limited to a quadrilateral). The convex polygonal path passes through the light-emitting dies 22a, 22b and 22c. The light-emitting dies 22a, 22b and 22c are closer to the central portion 2034b and there is a light-emitting distance d1b between the light-emitting dies 22a, 22b and 22c and the central portion 2034b. Similarly, in practice, the light-emitting distance d1b can be designed to be between 0.3 mm and 0.5 mm. If the light-emitting dies 22a, 22b and 22c are closer to the peripheral portion 2032b and there is a light-emitting distance d1b' between the light-emitting dies 22a, 22b and 22c and the peripheral portion 2032b. Similarly, in practice, the light-emitting distance d1b' can also be designed to be between 0.3 mm and 0.5 mm. Furthermore, in FIG. 5 and FIG. 6, the convex polygonal path can also be a triangular path, a hexagonal path, etc. in practice. The profiles of the central portions 2034a and 2034b can also be other convex polygonal profiles, e.g. a triangular profile, a hexagonal profile, etc.

Please refer to FIG. 1 to FIG. 3. In the embodiment, the keycap 12 has a permeable indicator area 12a (shown by a dashed frame in the figures). Light emitted by the light-emitting dies 22a, 22b and 22c can pass through the permeable indicator area 12a to produce a visual indication effect. In practice, the permeable indicator area 12a may be numbers, symbols, letters, characters, graphics or combinations thereof, etc.; in other words, the permeable indicator area 12a may contain a plurality of permeable characters, and the permeable characters may be numbers, symbols, letters, characters, graphics or combinations thereof; in other words, the permeable indicator area 12a may include a plurality of permeable characters, and the permeable character may be number, symbol, letter, character or graphic.

Figure 7:
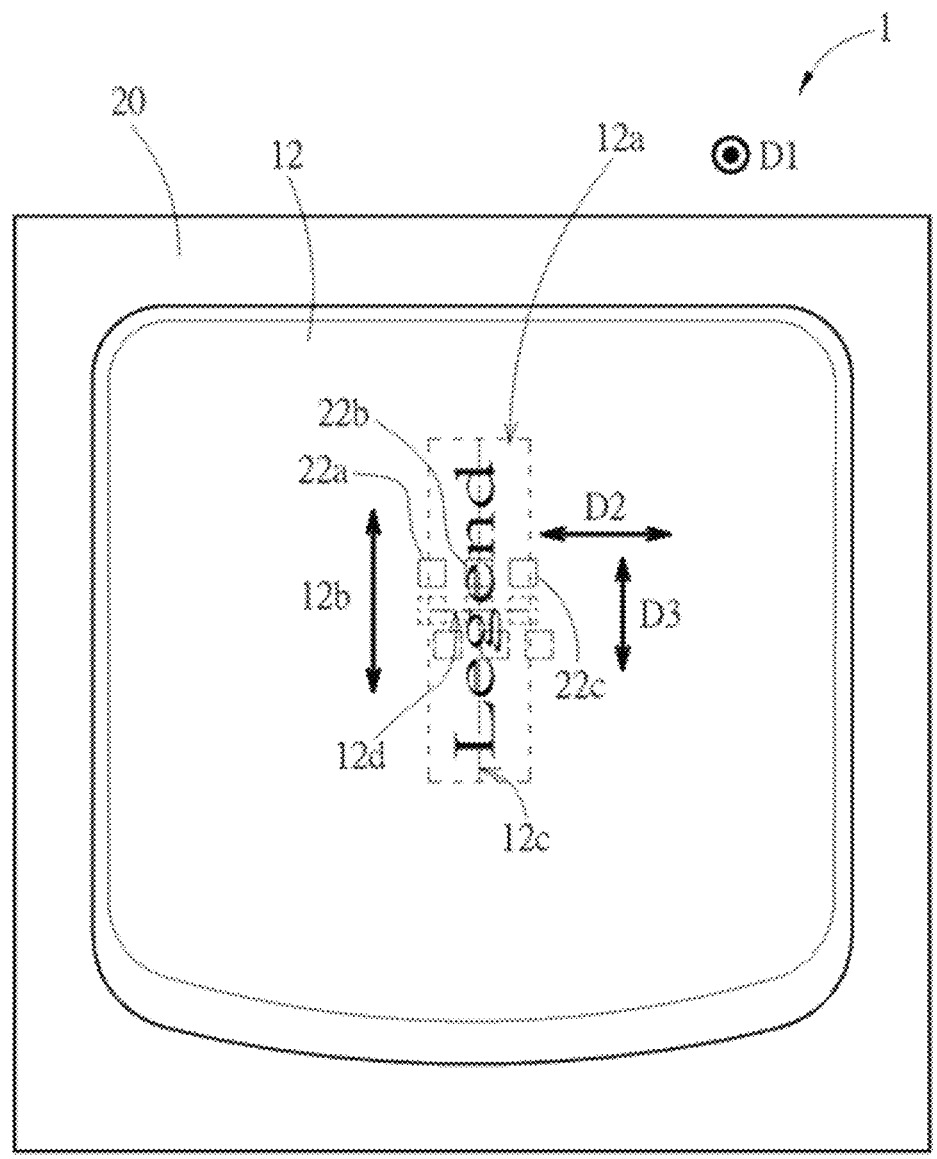
FIG. 7 is a top view of the illuminated keyswitch structure in FIG. 1.

Please also refer to FIG. 7 (in which the hidden profiles of the light-emitting dies 22a, 22b and 22c are shown in thin lines). FIG. 7 is a top view of the illuminated keyswitch structure in FIG. 1. In the embodiment, the permeable indicator area 12a has a lengthwise direction 12b (e.g. the arrangement direction of the letters in the figure, indicated by a double-headed arrow in FIG. 7). The light-emitting dies 22a, 22b and 22c are arranged under the permeable indicator area 12a perpendicular to the lengthwise direction 12b (that is, the arrangement direction D2 is perpendicular to the lengthwise direction 12b), thereby reducing or eliminating the influence of uneven light mixing on the permeable indicator area 12a caused by excessive arrangement spacing of the light-emitting dies 22a, 22b, and 22c. In other words, the two ends of the permeable indicator area 12a (and the permeable indicator area 12a' of the following embodiment) are heterochromatic sensitive areas, which are prone to uneven light mixing which causes color deviation of the light when exiting from the keycap 12. The permeable indicator area 12a may include a plurality of permeable characters. The plurality of permeable characters are arranged along a long axis. The so-called heterochromatic sensitive area is the end character on both sides of the plurality of permeable characters.

Furthermore, in the embodiment, the permeable indicator area 12a is rectangular, on which a long axis 12c and a short axis 12d are defined (both are shown in dashed lines in FIG. 7). The long axis 12c is parallel to the lengthwise direction 12b. The short axis 12d is perpendicular to the lengthwise direction 12b. The permeable indicator area 12a is symmetrical with respect to the long axis 12c and the short axis 12d respectively. In terms of vertical projection, the light-emitting dies 22a, 22b and 22c as a whole (that is, the plurality of light-emitting dies are regarded as a whole, the same below) pass through the long axis 12c and the center of the light-emitting dies 22a, 22b, 22c as a whole (i.e. the light-emitting die 22b In this embodiment) is located on the long axis 12c. In practice, the light-emitting dies 22a, 22b and 22c as a whole can also be designed to pass through the center of the long axis 12c, as shown by the rectangles in dashed lines in FIG. 7. In this case, the light-emitting dies 22a, 22b and 22c as a whole also pass through the center of the short axis 12d. The center of the light-emitting dies 22a, 22b and 22c as a whole (i.e. the light-emitting die 22b in this embodiment) is also located at the centers of the long axis 12c and the short axis 12d; however, it is not limited thereto. For example, the light-emitting dies 22a, 22b and 22c are offset parallel to the short axis 12d, so that the center of the light-emitting dies 22a, 22b and 22c as a whole deviates from the centers of the long axis 12c and the short axis 12d (for example, the light-emitting die 22a or 22c is located at the centers of long axis 12c and short axis 12d; for another example, the light-emitting dies 22a, 22b and 22c are not located at the centers of long axis 12c and short axis 12d, as shown by rectangles in dashed lines in FIG. 7). In addition, in the illuminated keyswitch structure 1, although the light-emitting dies 22a, 22b and 22c are arranged in a straight line, they can also be arranged in a non-linear arrangement in practice, e.g. in a triangular arrangement. In this case, when the light-emitting dies 22a, 22b and 22c can be close enough to each other (which can be obtained through the actual test of the product), the influence of uneven light mixing on the permeable indicator area 12a caused by excessive arrangement spacing of the light-emitting dies 22a, 22b, and 22c can also be reduced or eliminated. The technical solutions in this embodiment are to dispose the plurality of light-emitting dies 22a, 22b and 22c at the same side of the heterochromatic sensitive area; that is, the light-emitting dies 22a, 22b and 22c are simultaneously disposed at the same side of the end character of the plurality of permeable characters. For the end character "L", the light-emitting dies 22a, 22b and 22c are arranged together at the same side of the end character "L"; for the end character "d" on the other side, the plurality of light-emitting dies 22a, 22b and 22c are arranged together at the same side of the end character "d". As far as the end character "L" regarded as a heterochromatic sensitive area is concerned, the arrangement direction of the light-emitting dies 22a, 22b and 22c is at least partially perpendicular to the permeable indicator area 12a, so that the distances to the same heterochromatic sensitive area (the end character "L") are close to each other, which can reduce the color deviation. Similarly, as far as the end character "d" regarded as a heterochromatic sensitive area is concerned, the arrangement direction of the light-emitting dies 22a, 22b and 22c is at least partially perpendicular to the permeable indicator area 12a, so that the distances to the same heterochromatic sensitive area (the end character "d") are close to each other, which can also reduce the color deviation.

In the present disclosure, a coverage space of the keycap 12 in the vertical direction D1 has a heterochromatic sensitive area. The heterochromatic sensitive area is, for example, an end of the permeable indicator area 12a of the keycap 12. The plurality of light-emitting dies 22a, 22b and 22c are located at the same side of the projection of the heterochromatic sensitive area (the end of the permeable indicator area 12a) in the vertical direction D1. Because the distances from the plurality of light-emitting dies 22a, 22b and 22c to the end of the permeable indicator area 12a are close to each other, the light of different colors emitted by the plurality of light-emitting dies 22a, 22b and 22c can travel to the end of the permeable indicator area 12a at similar distances, which can suppress the influence of uneven light mixing and color deviation.

In the illuminated keyswitch structure 1, the switch contact pads 202 are approximately located in the central area, but it is not limited to this in practice. For example, the switch contact pads 202 are offset from the center area and are triggered by the keycap 12 (e.g. by a downwardly protruding structure) or the support (the first support 16 or the second support 18). In this case, the light-emitting dies 22a, 22b and 22c can be kept far below the resilient dome 26, so that the light emitted by the light-emitting dies 22a, 22b and 22c does not need to pass through the resilient dome 26, reducing light intensity attenuation. Furthermore, the circuitry of the switch circuit board 20 generally refers to a collection of a plurality of traces and a plurality of circuit elements (e.g., the switch contact pads 202 mentioned above), which are the objects that the light-emitting dies 22a, 22b and 22c need to avoid. In detail, in the illuminated keyswitch structure 1, the light-emitting dies 22a, 22b and 22c are closer to the switch contact pads 202 than other parts of the circuitry. However, in practice, the light-emitting dies 22a, 22b and 22c may also be closer to other parts of the circuitry than the switch contact pads 202.

Figure 8:
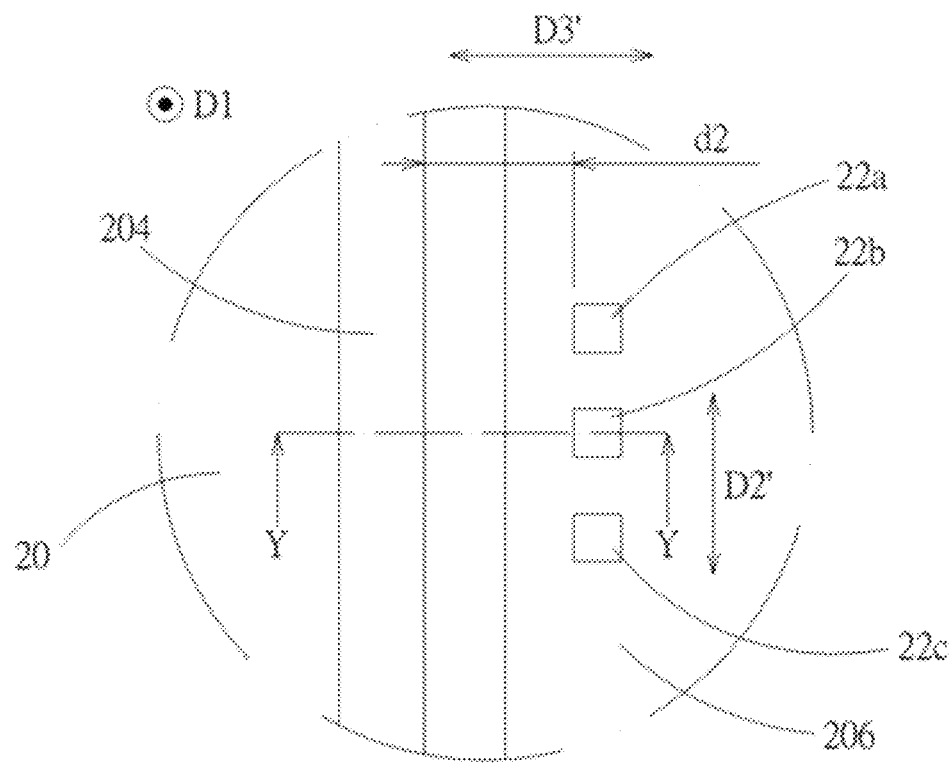
FIG. 8 is a schematic diagram illustrating a portion of a top view configuration of the switch circuit board and the light-emitting dies according to another embodiment.

For example, in another embodiment, as shown by FIG. 8 (in which the hidden profile of the circuitry of the switch circuit board is shown in thin lines), the light-emitting dies 22a, 22b and 22c are disposed close to a trace segment 204. The trace segment 204 extends straight. The arrangement direction D2' of the light-emitting dies 22a, 22b and 22c is parallel to the trace segment 204. There is a light-emitting distance d2 (i.e. the distance from the projection of the whole profiles of the light-emitting areas of the light-emitting dies 22a, 22b and 22c on the switch circuit board 20 to the trace segment 204) in the horizontal direction D3' between the light-emitting dies 22a, 22b and 22c and the trace segment 204. In practice, the light-emitting distance d2 can also be designed to be between 0.3 mm and 0.5 mm.

In practice, the switch circuit board 20 may also be disposed under the base plate 14 as required. In this case, the switch circuit board 20 is closer to the lowermost light-emitting die 22a, 22b and 22c and covers a larger light-emitting range, and it is necessary to be farther away from the circuitry of the switch circuit board 20 to a greater extent. For circuit elements (e.g. the switch contact pads 202) or traces (e.g. the trace segment 204) that make up the circuitry, proper values for the light-emitting distances d1 and d2 may exceed the above-mentioned higher boundary value, 0.5 mm. In some practicable examples, the proper values for the light-emitting distances d1 and d2 are 0.59 mm, 0.66 mm and 0.78 mm. When the circuitry of the switch circuit board 20 is far away from the light-emitting dies 22a, 22b and 22c, e.g., using the base plate 14 with a larger thickness, or because of other structural parts that are added due to the illuminated keyswitch structure 1 (e.g. a movable plate, a magnetic, protrusions, etc. that are used for magnetic restoration or keyboard sinking), the proper values for the light-emitting distances d1 and d2 may be less than the lower boundary value. For example, in some practicable examples, the proper values for the light-emitting distances d1 and d2 are 0.27 mm, 0.23 mm and 0.17 mm. Therefore, according to the experimental data of different product models, the light-emitting distances d1 and d2 are preferably within the range from 0.17 mm to 0.78 mm.

Besides, the switch contact pads 202 may be printed on the upper and lower transparent sheets of the switch circuit board 20, respectively. The switch contact pads 202 on the upper and lower transparent sheets may have different patterns and outer diameters. The light-emitting dies 22a, 22b and 22c usually need to avoid the outermost edges of the switch contact pads 202 on the upper layer and lower layer of the switch circuit board 20; that is, the above light-emitting distance d1 have to be based on the overall outline of the switch contact pads 202 as a whole on the upper layer and lower layer.

Figure 9:
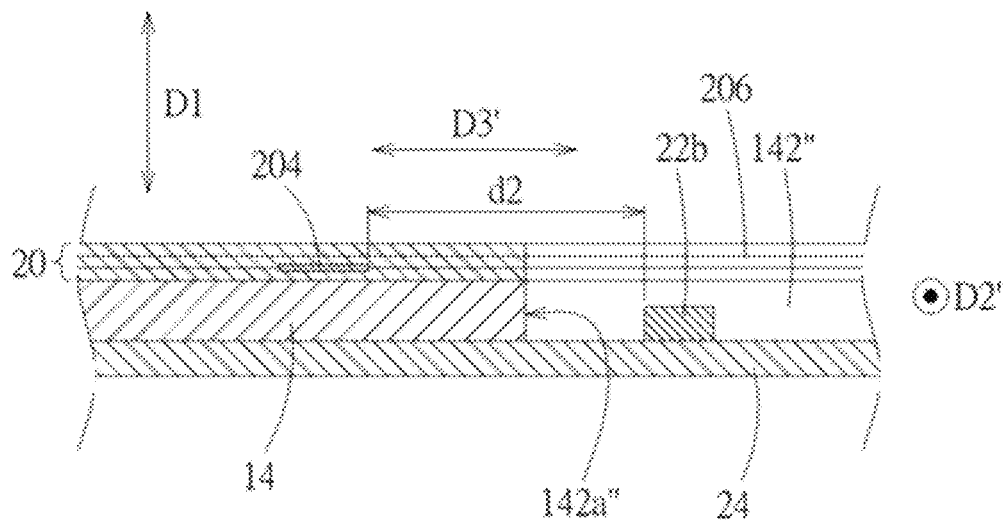
FIG. 9 is a sectional view along the line Y-Y corresponding to the embodiment in FIG. 8.

Furthermore, please also refer to FIG. 8 and FIG. 9. FIG. 9 is a sectional view along the line Y-Y corresponding to the embodiment in FIG. 8. In this embodiment, the switch circuit board 20 has a through hole 206. The light-emitting dies 22a, 22b and 22c are disposed opposite right to a through hole 142" of the base plate 14 and the through hole 206, so that light emitted upward by the light-emitting dies 22a, 22b and 22c can pass through the through hole 142" and the through hole 206 to illuminate the keycap 12, which can eliminate the intensity attenuation that occurs when the light passes through the physical structure of the switch circuit board 20. In the configuration shown by FIG. 4A, if the structural design allows, the switch circuit board 20 can also form through holes opposite right to the light-emitting dies 22a, 22b and 22c near the switch contact pads 202 to reduce the intensity attenuation of light.

In addition, in the embodiment, all the light-emitting dies 22a, 22b and 22c for providing the keycap 12 backlight are arranged in a straight line parallel to the flat edge 202a, but it is not limited thereto in practice. For example, the light-emitting dies 22a, 22b and 22c are arranged in other arrangements (e.g. arcs, triangles, polygons, arrays, etc.); therein, the distance in the horizontal direction D3 between the light-emitting die 22a, 22b or 22c closest to the switch contact pad 202 and the switch contact pad 202 is defined as the light-emitting distance. Similarly, the portion of the profile of the switch contact pad 202 close to the light-emitting dies 22a, 22b and 22c is not limited to a straight line. The trace segment 204 close to the light-emitting dies 22a, 22b and 22c is also not limited to a straight line. The closer the light-emitting dies 22a, 22b and 22c can be disposed to the circuitry, the more the range for the light-emitting dies 22a, 22b and 22c to dispose can be increased, that is, increasing the design flexibility of the permeable indicator area 12a.

Figure 10:
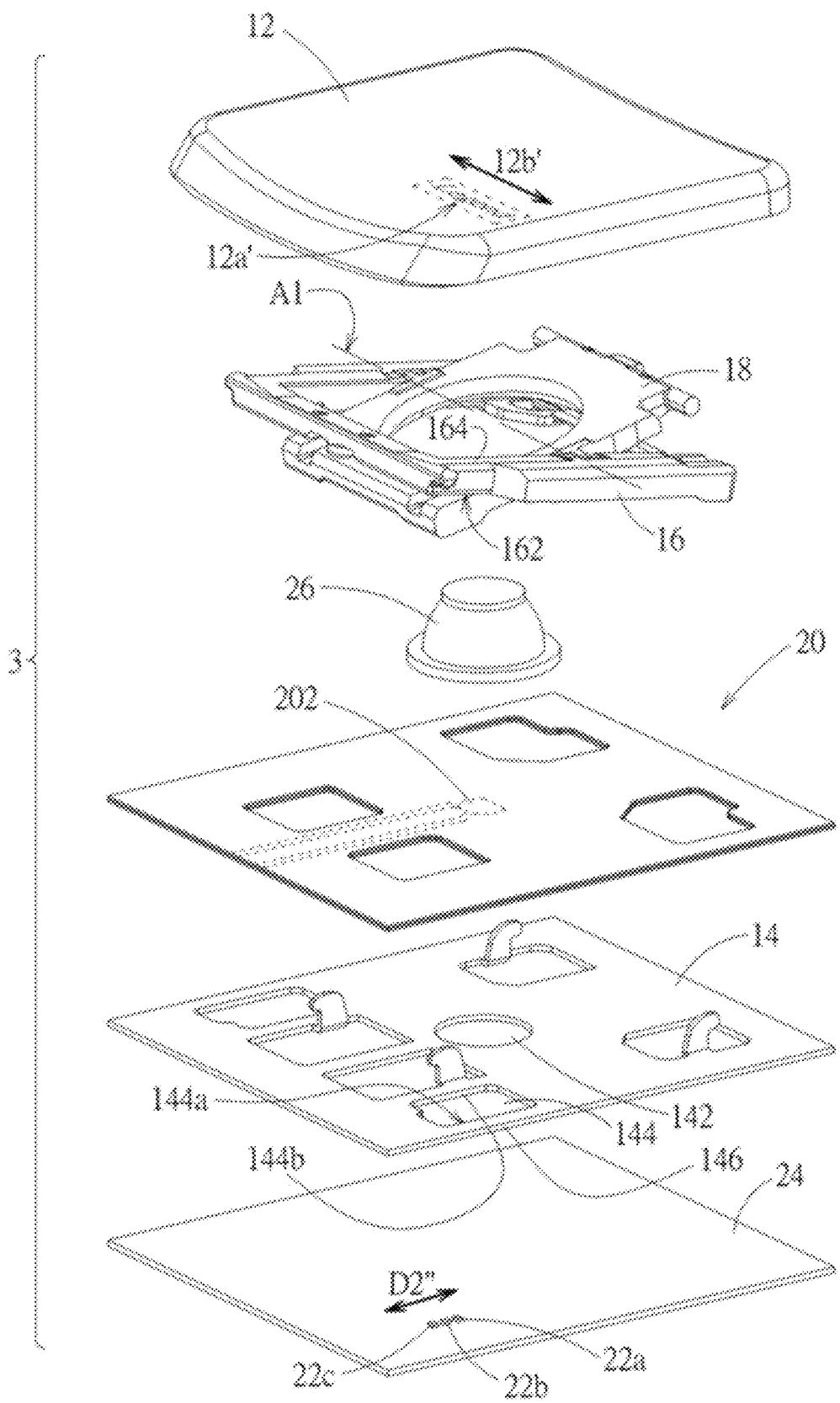
FIG. 10 is a schematic diagram illustrating an illuminated keyswitch structure according to another embodiment.
Figure 11A:
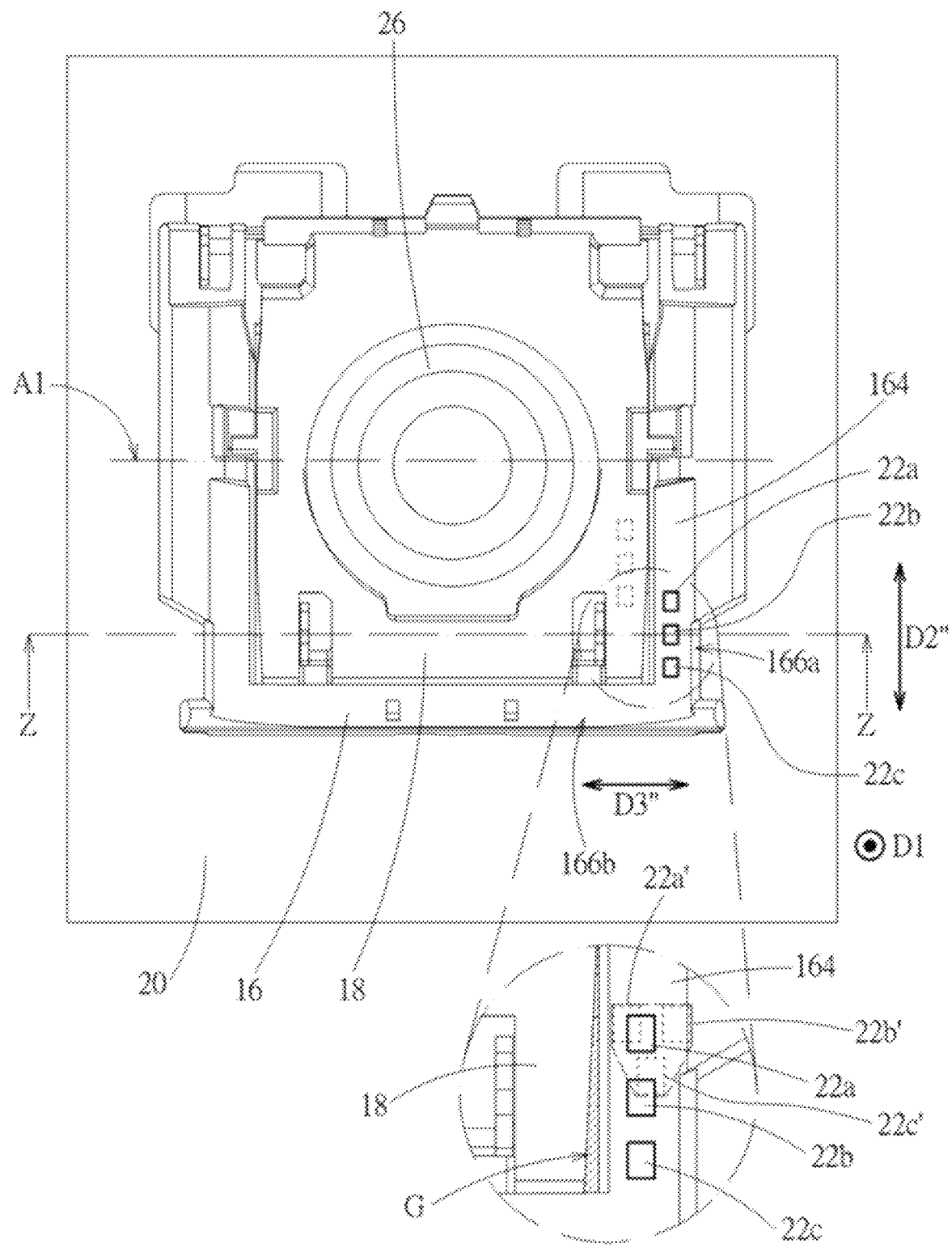
FIG. 11A is a top view of the illuminated keyswitch structure after the keycap is removed.

Please refer to FIG. 10 and FIG. 11A, which show an illuminated keyswitch structure 3 according to another embodiment. The illuminated keyswitch structure 3 is structurally similar to the illuminated keyswitch structure 1. The illuminated key switch structure 3 in principle follows the component symbols of the illuminated key switch structure 1. For other descriptions about the illuminated keyswitch structure 3, please refer to the relevant descriptions of the same named components and their variations in the illuminated keyswitch structure 1 in the foregoing. In the illuminated keyswitch structure 3, the first support 16 and the second support 18 are disposed opposite to each other and are light permeable, and are connected together to the bottom side of the keycap 12 and the top side of the base plate 14.

When the keycap 12 is not pressed yet, the permeable first support 16 and the permeable second support 18 are an X-shaped scissors support in an extended state (as shown in FIG. 10 or refer to FIG. 3). In other words, light emitted by the light-emitting dies 22a, 22b and 22c disposed under the base plate 14 has different transmission paths and angles of incidence/reflection/refraction at different surface of different portions of sloping upper and lower halves and upper and lower ends of the first support 16 and the second support 18. The adjacent portions of the first support 16 and the second support 18 belong to the heterochromatic sensitive area, or the vertical space covering a gap projection G is the heterochromatic sensitive area, which is prone to uneven light mixing which causes color deviation of the light when reaching the keycap 12. If a monochromatic light source is disposed within the gap projection G (represented by dashed hatching in FIG. 11A, that is, the projection of the gap between the first support 16 and the second support 18 in the vertical direction D1) of the first support 16 and the second support 18, the light will be directly or indirectly transmitted through different portions of the first support 16 and the second support 18 to illuminate the keycap 12, which will eventually cause serious uneven illumination. If light sources of different colors such as the light-emitting dies 22a, 22b and 22c are disposed in the gap projection G (or overlapping with the gap projection G), color deviation will occur at different positions of the keycap 12 due to uneven light mixing.

Please refer to FIG. 10 and FIG. 11A. Therefore, in the embodiment, all the light-emitting dies 22a, 22b and 22c (whose hidden profile is shown in bold lines in FIG. 11A) for providing backlight are disposed under the first support 16 (that is, the light-emitting dies 22a, 22b and 22c are located within the projection of the first support 16 in the vertical direction D1) and located within the through hole 144 (or under the base plate opposite right to the through hole 144 of the base plate 14; that is, the light-emitting dies 22a, 22b and 22c are located within the projection of the through hole 144 in the vertical direction D1). The light emitted by the light-emitting dies 22a, 22b and 22c travels upward from the through hole 144 and passes through the first support 16 (or passes through the through hole 144 and the first support 16) to illuminate the keycap 12. Since the light emitted by the light-emitting dies 22a, 22b and 22c passes through the same support, in principle, the light is affected very similarly (e.g. intensity attenuation, divergence or deviation of travelling path, etc.), which can suppress the degree of color deviation of the light that may occur after the light passes through the structural parts. Furthermore, in the embodiment, the light emitted by the light-emitting dies 22a, 22b and 22c enters the first support 16 from the lower surface 162 of the first support 16 and exits out the first support 16 from the upper surface 164 of the first support 16. The lower surface 162 and the upper surface 164 are parallel. This structural configuration also helps to suppress the degree of color deviation of the light that may occur after the light passes through the structural parts. Similarly, in practice, the light-emitting dies 22a, 22b and 22c can also be changed to be disposed under the second support 18, as shown in dashed lines in FIG. 11A. In this way, as long as the gap projection G (i.e. the projection area of the gap between the first support 16 and the second support 18 in the vertical direction) of the first support 16 and the second support 18 does not overlap with the light-emitting dies 22a, 22b and 22c, which can avoid color deviation. That the gap projection G of the first support 16 and the second support 18 does not overlap with the light-emitting dies 22a, 22b and 22c not only means that the gap projection G does not directly overlap with any one of the light-emitting dies 22a, 22b and 22c itself, but also contains the situation that the gap projection G does not pass through the gaps between any adjacent two of the light-emitting dies 22a/22b and 22b/22c (that is, the gap projection G does not overlap with or pass through the whole light-emitting dies 22a, 22b and 22c). The light-emitting dies 22a, 22b and 22c as a whole can be logically represented by a single convex polygonal region that can cover all light-emitting dies 22a, 22b and 22c. For example, the light-emitting dies 22a, 22b and 22c are not arranged in a straight line (shown by dashed rectangles in the enlarged view in FIG. 11A), and the whole can be covered by a convex hexagonal region (shown by a dashed polygon in FIG. 11A, or in terms of lines connecting their centers, they are arranged in a triangle). On the premise that the gap projection G does not overlap with or pass through the whole light-emitting dies 22a', 22b' and 22c', the arrangement of the light-emitting dies 22a', 22b' and 22c' and the gap projection G may also have a specific relative relationship. For example, at least two of the light-emitting dies 22a', 22b' and 22c' that are arranged in a triangle in FIG. 11A are arranged in the horizontal direction D3" (that is, at least two of the light-emitting dies 22a', 22b' and 22c' are arranged parallel to the horizontal direction D3") and perpendicular to the gap projection G (that is, the gap projection G extends roughly parallel to the arrangement direction D2").

Figure 11B:
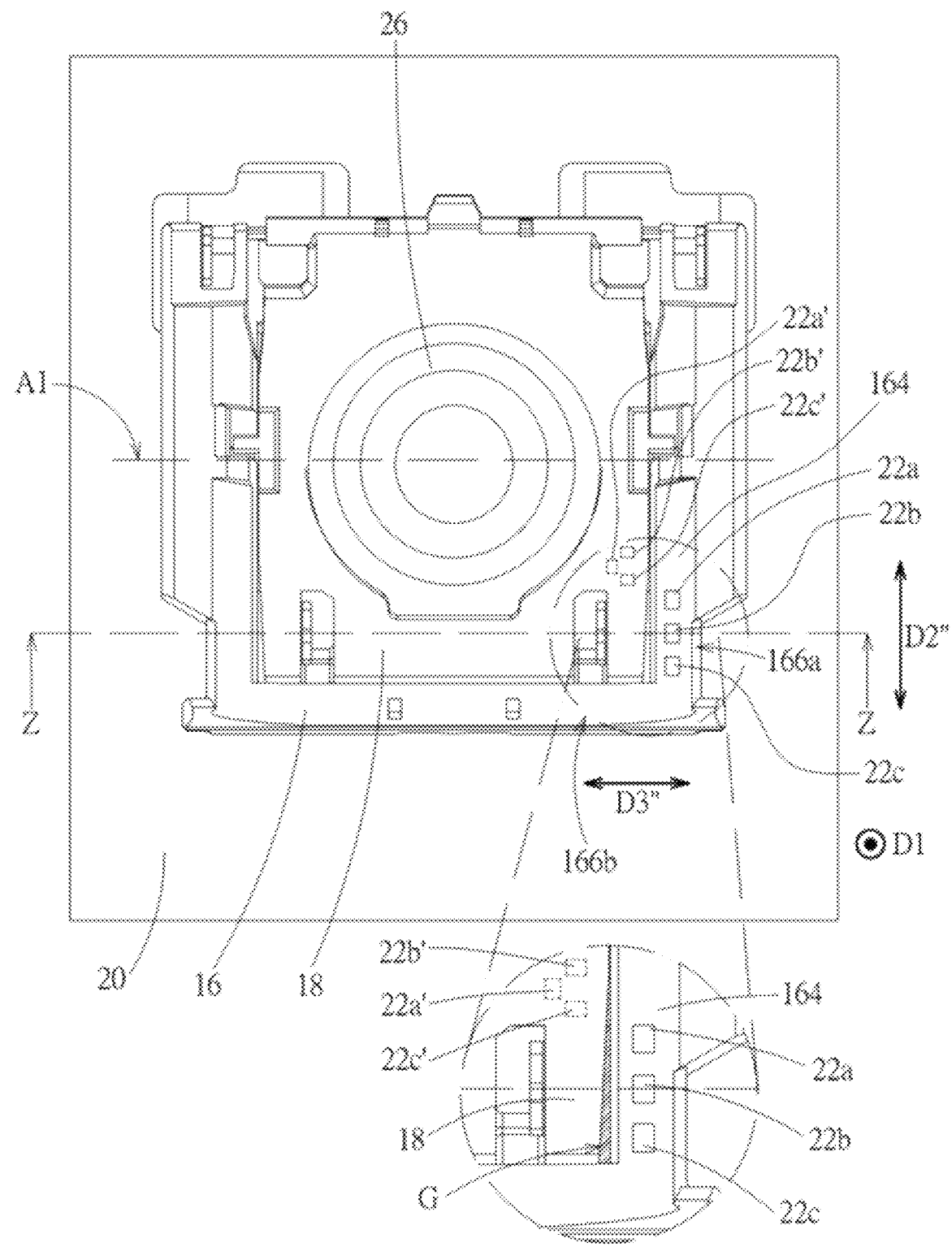
FIG. 11B is a schematic diagram illustrating a top view configuration of another embodiment extended from FIG. 11A.

Besides, as shown by the three light-emitting dies 22a', 22b' and 22c' shown in dashed lines in FIG. 11B and arranged in a triangle on the second support 18, when the light-emitting dies 22a', 22b' and 22c' in dashed lines are arranged in a triangle (in terms of their central connections), the light emitting dies 22b' and 22c' are arranged in a straight line with edges parallel to each other (i.e. parallel to each other), and the light-emitting die 22a' is not located within the union range of the light-emitting dies 22b' and 22c' (e.g., the axes of the light-emitting die 22b' and the light-emitting die 22c' are a straight line, and the axis of the light-emitting die 22a' is not located on the straight line). In order to avoid local slight color deviation caused by at least two of the light-emitting dies 22a', 22b' and 22c' in dashed lines that are adjacent to the gap projection G between the adjacent portions of the first support 16 and the second support 18 at the same time, but have unequal distances to the gap projection G, the arrangement direction D2" of the at least two of the light-emitting dies 22a', 22b' and 22c' in dashed lines that are adjacent to the gap projection G can be parallel to the gap projection G and perpendicular to the horizontal direction D3". As for the third light-emitting dies 22a', 22b' or 22c' arranged in the triangle, it is roughly located on the line connecting the centers of the two light-emitting dies 22a', 22b' or 22c' in dashed lines. The third light-emitting dies 22a', 22b' or 22c' in dashed lines can be farther from the gap projection G, or can be closer to the gap projection G than the other two.

Furthermore, in the embodiment, the whole first support 16 shows a rectangular frame. The light-emitting dies 22a, 22b and 22c are located under a frame portion 166a of the rectangular frame. A projection of the frame portion 166a in the vertical direction D1 has a lengthwise direction (in the view point of FIG. 11A, the lengthwise direction is equivalent to the arrangement direction D2" of the light-emitting dies 22a, 22b and 22c). The lengthwise direction is parallel to the arrangement direction D2" of the light-emitting dies 22a, 22b and 22c. In practice, the light-emitting dies 22a, 22b and 22c can be located under a frame portion 166b of the rectangular frame. The light-emitting dies 22a, 22b and 22c are arranged parallel to the lengthwise direction (or extension direction) of the frame portion 166b. Furthermore, the first support 16 may also be realized by frames in other geometric configurations, such as U-shaped (or n-shaped) frames.

To sum up, the above technical solutions in this embodiment are to dispose the light-emitting dies 22a, 22b, 22c and 22a', 22b' or 22c' at the same side of the heterochromatic sensitive area, i.e. the gap projection G. At the same time, for the light-emitting dies 22a, 22b and 22c, the distances to the same heterochromatic sensitive area (i.e. the gap projection G) are close to each other. For the light-emitting die 22a', 22b' or 22c', the distances to the same heterochromatic sensitive area (i.e. the gap projection G) are also close to each other. For example, the size of the keycap is in the order of cm, and the distances between the plurality of light-emitting dies are less than 1 mm. In this way, that the distances to the same heterochromatic sensitive area are close to each other means that the differences between the distances from each light-emitting die to the same heterochromatic sensitive area (the gap projection G) are almost negligible (e.g., the differences between the distances from each light-emitting die to the same heterochromatic sensitive area are less than 1 mm). The color deviation caused by such a small distance difference is not discernible by the human eye.

In the present disclosure, the coverage space of the keycap 12 in the vertical direction D1 has a heterochromatic sensitive area. The heterochromatic sensitive area is, for example, the gap projection G between the first support 16 and the second support 18. The plurality of light-emitting dies 22a, 22b and 22c as a whole do not overlap with the gap projection G. Since the light of different colors emitted by the multiple light-emitting dies 22a, 22b and 22c can travel at similar distances, the influence of the gap projection G on uneven light mixing and color deviation can be suppressed.

Figure 12:
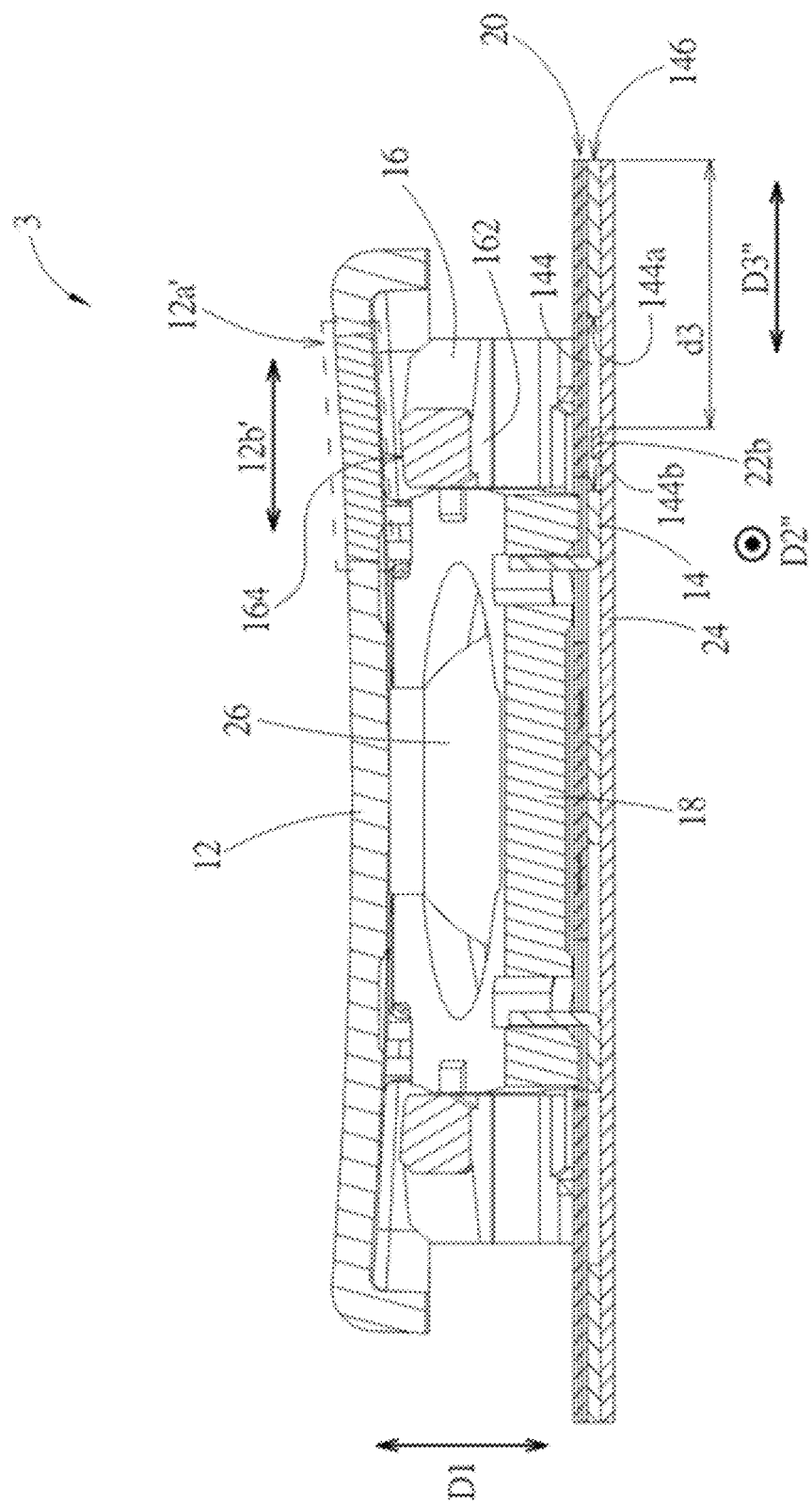
FIG. 12 is a sectional view along the line Z-Z in FIG. 11A.

Furthermore, please also refer to FIG. 10 and FIG. 12. In the embodiment, the base plate 14 has an outer plate edge 146 in the horizontal direction D3" that is closest to the light-emitting dies 22a, 22b and 22c. There is a light-emitting distance d3 between the light-emitting dies 22a, 22b and 22c and the outer plate edge 146. In principle, the farther the light-emitting dies 22a, 22b and 22c are away from the outer plate edge 146, the more the base plate 14 can restrain the light emitted by the light-emitting dies 22a, 22b and 22c from escaping from the outer plate edge 146. In practice, the proper values for the light-emitting distance d3 of multiple models are 4.8 mm, 5.3 mm, 6.2 mm, 7.1 mm and 7.7 mm. The light-emitting distance d3 is preferably within the range from 4.8 mm to 7.7 mm. Furthermore, in the embodiment, the arrangement direction D2" of the light-emitting dies 22*a*, 22*b* and 22*c* is parallel to the outer plate edge 146, but it is not limited thereto in practice.

Figure 13A:
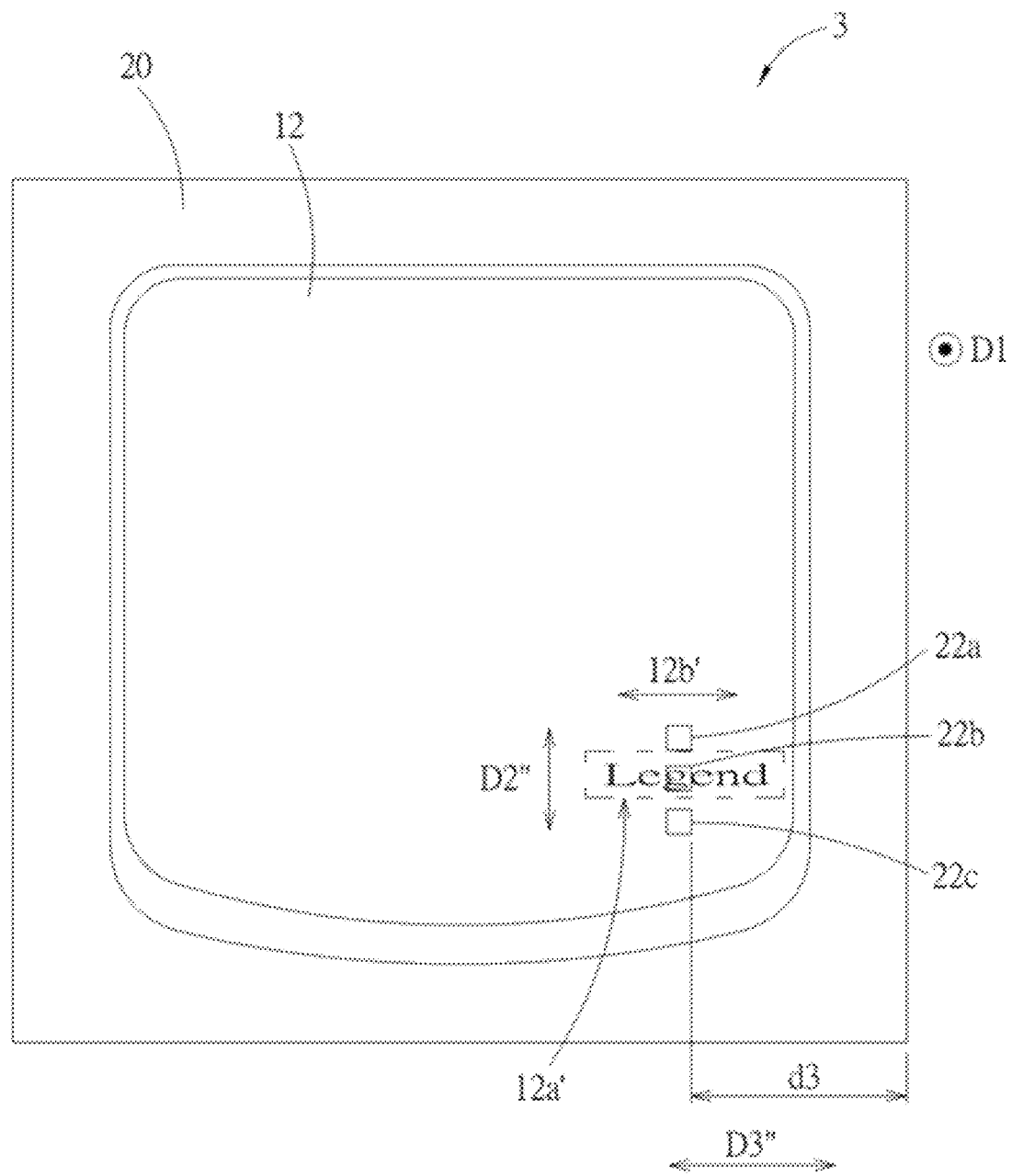
FIG. 13A is a top view of the illuminated keyswitch structure in FIG. 10.
Figure 13B:
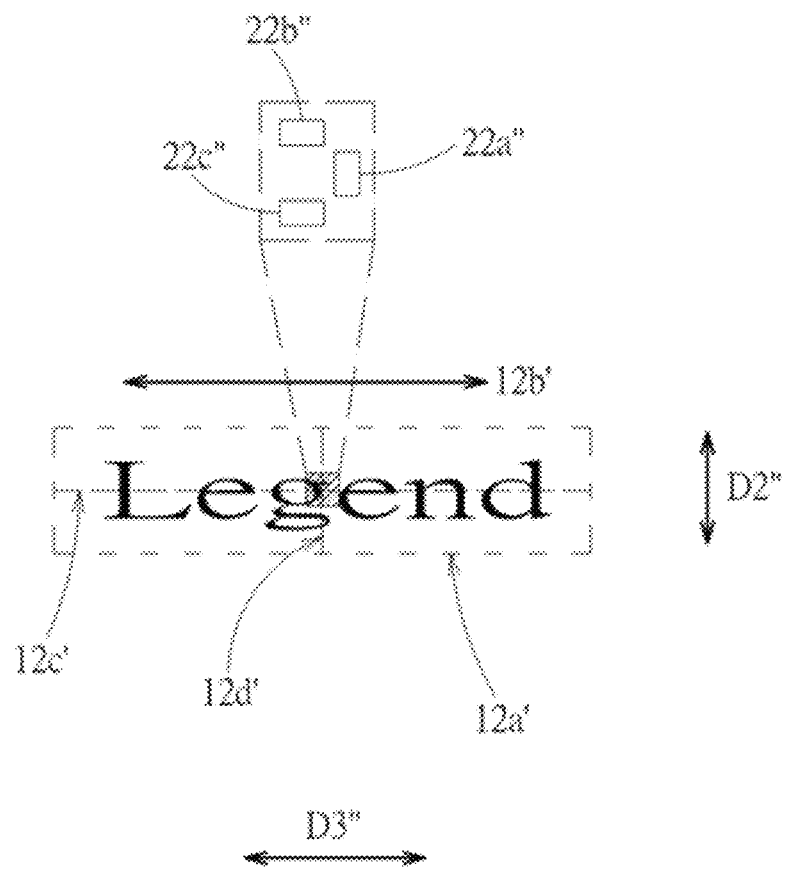
FIG. 13B is a top view of a portion of another embodiment extended from FIG. 13A.

Furthermore, please also refer to FIG. 13A. FIG. 13A is a top view of the illuminated keyswitch structure in FIG. 10, in which the hidden profiles of the light-emitting dies 22*a*, 22*b* and 22*c* are shown in thin lines. In general, the arrangement direction of monochromatic light sources does not need to consider the lengthwise direction 12*b*' of the permeable indicator area 12*a*' of the keycap 12. However, in the case of multi-color light sources, e.g. mixing light of three colors emitted by the light-emitting dies 22*a*, 22*b* and 22*c* into various colors that need to be presented, if the arrangement direction D2" of the light-emitting dies 22*a*, 22*b* and 22*c* is perpendicular to the lengthwise direction 12*b*' of the permeable indicator area 12*a*' of the keycap 12, the two light-emitting dies 22*a* and 22*c* on the outside provide the most sufficient light to the adjacent character section, but the character section far away from the light-emitting dies 22*a* and 22*c* has the problem of insufficient light, which causes color deviation on the two distal sections of the permeable indicator area 12*a*' in the lengthwise direction 12*b*'. Besides, FIG. 13B is a top view of a portion of another embodiment extended form FIG. 13A, in which the light-emitting dies 22*a*, 22*b* and 22*c* are arranged in a triangle (in terms of lines connecting their centers); that is, the long edge of the light-emitting die 22*b*" and the long edge of the light-emitting die 22*c*" are arranged perpendicular to the arrangement direction D2", and the light-emitting die 22*a*" is not located in the union range of the light-emitting dies 22*b*" and 22*c*". If necessary, the long edge of the light-emitting die 22*a*" is parallel to the short edges of the light-emitting dies 22*b*" and 22*c*", but the long edge of the light-emitting die 22*a*" is perpendicular to the long edges of the light-emitting dies 22*b*" and 22*c*". The arrangement direction D2" of at least two light-emitting dies 22*b*" and 22*c*" is perpendicular to the lengthwise direction 12*b*'/long axis direction 12*c*' of the permeable indicator area 12*a*', also perpendicular to the horizontal direction D3", and parallel to the short axis direction 12*d*'. The light-emitting dies 22*b*" and 22*c*" are located at the same side of the same heterochromatic sensitive area, i.e., the same side of the first permeable character "L" or second permeable character "d" of the end characters, and the distances to the same heterochromatic sensitive area, i.e., the end character "L" or "d" are already close to each other, so the color deviation can be eliminated. As for the third light-emitting die 22*a*', it is disposed preferably adjacent to the center line of the short axis 12*d*' of the permeable indicator area 12*a*'. In this case, there is no other light-emitting part under the permeable indicator area 12*a*', except for the light-emitting dies 22*a*", 22*b*" and 22*c*". If necessary, the line connecting the first permeable character "L" and the second permeable character "d" passes through the union range of the light-emitting dies 22*a*", 22*b*" and 22*c*", or the line connecting the first permeable character "L" and the second permeable character "d" passes through the light-emitting die 22*a*", or the center of the union range of the light-emitting dies 22*a*", 22*b*" and 22*c*" is located at the center point of the long axis of the permeable indicator area 12*a*'. Overall, the light-emitting dies 22*a*", 22*b*" and 22*c*" are preferably adjacent to the geometric center of the permeable indicator area 12*a*'.

In the embodiment, in the keycap 12, the lengthwise direction 12*b*' of the permeable indicator area 12*a*' above the light-emitting dies 22*a*, 22*b* and 22*c* is perpendicular to the arrangement direction D2", thus reducing or eliminating the influence of uneven light mixing on the permeable indicator area 12*a*' caused by the spaced arrangement of the light-emitting dies 22*a*, 22*b* and 22*c*. In addition, for other descriptions about the relative position relationship between the light-emitting dies 22*a*, 22*b* and 22*c* and the permeable indicator area 12*a*', please refer to the relevant descriptions of the relative position relationship between the light-emitting dies 22*a*, 22*b* and 22*c* and the permeable indicator area 12*a* and variations thereof, which will not be repeated. In addition, in the embodiment, the through hole 144 is roughly rectangular. Hole edges 144*a* and 144*b* of the through hole 144 are parallel to an edge of the permeable indicator area 12*a*'. The arrangement direction D2" of the light-emitting dies 22*a*, 22*b* and 22*c* is parallel to the hole edges 144*a* and 144*b* (equivalent to inner plate edges) of the through hole 144, as shown by FIG. 10 and FIG. 12. This configuration is conducive to reduction of the influence of the through hole 144 on the light field provided by the light-emitting dies 22*a*, 22*b* and 22*c* to the permeable indicator area 12*a*'. The above description also applies to the arrangement of the light-emitting dies 22*a*, 22*b* and 22*c* relative to the through hole 142" in FIG. 8 and FIG. 9 (in which the light-emitting dies 22*a*, 22*b* and 22*c* are also disposed parallel to the hole edge 142*a*"). Furthermore, the arrangement parallel to the hole edge can also apply to the disposition of the light-emitting dies 22*a*, 22*b* and 22*c* relative to the through hole 142 (e.g., modified to be a rectangular hole) in the illuminated keyswitch structure 1, which will not be repeated.

In addition, in the illuminated keyswitch structure, in practice, the light-emitting dies 22*a*, 22*b* and 22*c* can also be modified to be arranged above the base plate 14, which can avoid the interference of the base plate 14 to the light emitted by the light-emitting dies 22*a*, 22*b* and 22*c*. In this case, the base plate 14 does not need to form a through hole corresponding to the light-emitting dies 22*a*, 22*b* and 22*c*, which is conducive to the strength of the base plate 14. Furthermore, the light-emitting dies 22*a*, 22*b* and 22*c* can be integrated into the circuitry of the switch circuit board 20. For example, the light-emitting dies 22*a*, 22*b* and 22*c* are disposed directly on the lower transparent sheet of the switch circuit board 20 and are powered by the circuitry on the lower transparent sheet. The middle and upper transparent sheets form openings correspondingly, so as to expose the light-emitting dies 22*a*, 22*b* and 22*c*. This structural configuration can eliminate the interference of the switch circuit board 20 to the light emitted by the light-emitting dies 22*a*, 22*b* and 22*c*.

Furthermore, in the illuminated keyswitch structures 1 and 3, the first support 16 and the second support 18 are pivotally connected with each other around the pivot axis A1 (indicated by a dashed line in the figures) through their middle portions to form an X-shaped scissors support; however, it is not limited thereto in practice. For example, the first support 16 and the second support 18 can be changed to be pivotally connected with each other through their end portions, or form a V-shaped butterfly support or an inverted V-shaped support by being directly connected onto the base plate 14 through their end portions. For another example, the first support 16 and the second support 18 can be changed to be opposite and spaced apart (e.g., each of them is rotatably connected to the base plate 14), and a linkage support is used to link the first support 16 and the second support 18. Furthermore, the illuminated keyswitch structures 1 and 3 use the resilient dome 26 as the restoring force mechanism; however, it is not limited thereto in practice. For example, the restoring force mechanism is realized by a spring or a magnetic attraction mechanism.

In practice, as shown by FIG. 10, in the embodiment, the keycap 12 has a permeable indicator area 12*a*'. The permeable indicator area 12a' has a lengthwise direction 12b'. The pivot axis A1 is parallel to the lengthwise direction 12b' of the permeable indicator area 12a'. When the light-emitting dies 22a, 22b and 22c are arranged as shown by FIG. 11A, the light of different colors emitted by the light-emitting dies 22a, 22b and 22c can travel to the ends of the permeable indicator area 12a' at similar distances, thereby suppressing the uneven light mixing and color deviation.

Furthermore, the foregoing describes the relative position relationships of the light-emitting dies 22a, 22b and 22c relative to the circuitry of the switch circuit board 20, and the first and second supports 16 and 18 with the illuminated keyswitch structures 1 and 3, respectively. In other embodiments, the illuminated keyswitch structure may also have both cases. For example, the switch contact pad 202 is located under the first support 16 or the second support 18 or adjacent to the position under the first support 16 or the second support 18, and the light-emitting dies 22a, 22b and 22c are located under the first support 16 or the second support 18. For another example, the light-emitting dies 22a, 22b and 22c located under the first support 16 or the second support 18 is also adjacent to the circuitry of the switch circuit board 20. Furthermore, in practice, some structural features of each embodiment may also be applied to other embodiments. For example, when the light-emitting dies 22a, 22b and 22c under the base plate 14 is disposed near the circuitry of the switch circuit board 20, the light-emitting dies 22a, 22b and 22c may be also near edges of the base plate 14, and hence the above illuminated keyswitch structure 3 is applicable herein.

Although the foregoing discloses the above preferably practical ranges of the light-emitting distances d1, d2 and d3 through actual implementation data, in practice, practical ranges of the light-emitting distances d1, d2 and d3 may be used with slightly reducing lighting effect relative to the above preferably practical ranges, which still can achieve a certain level of overall optical design benefits. Therefore, an addition or subtraction of 15% to 20% of the upper and lower boundary values of the preferably practical ranges of the light-emitting distances d1, d2 and d3 disclosed in the foregoing should still belong to the coverage range of the light-emitting distances d1, d2, and d3 in the foregoing.

Figure 14:
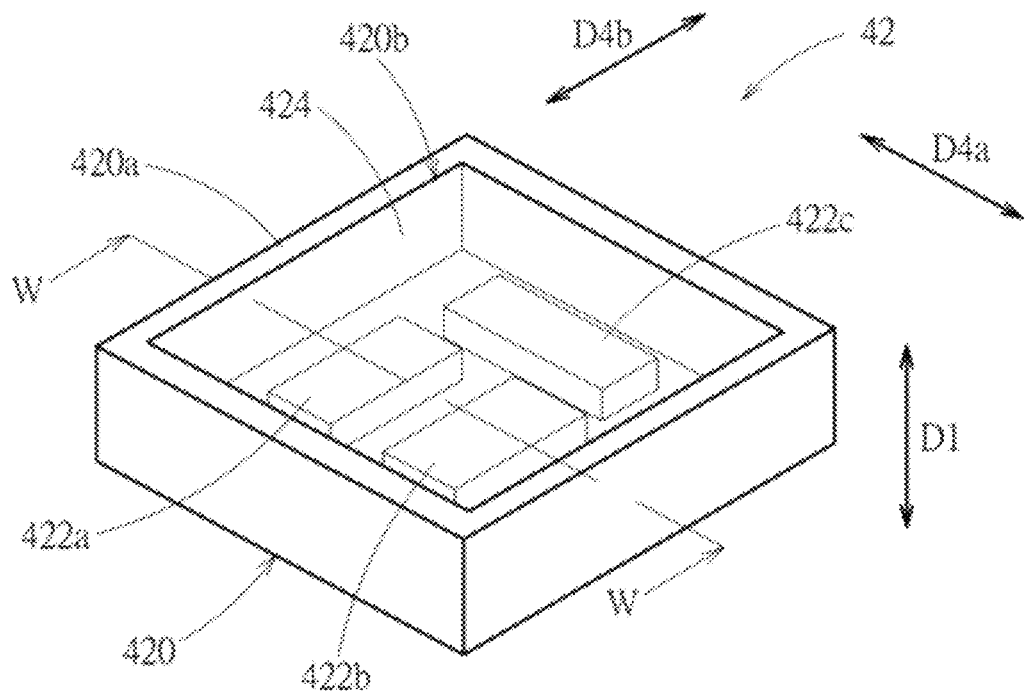
FIG. 14 is a schematic diagram illustrating a light-emitting die package according to a first embodiment.
Figure 15:
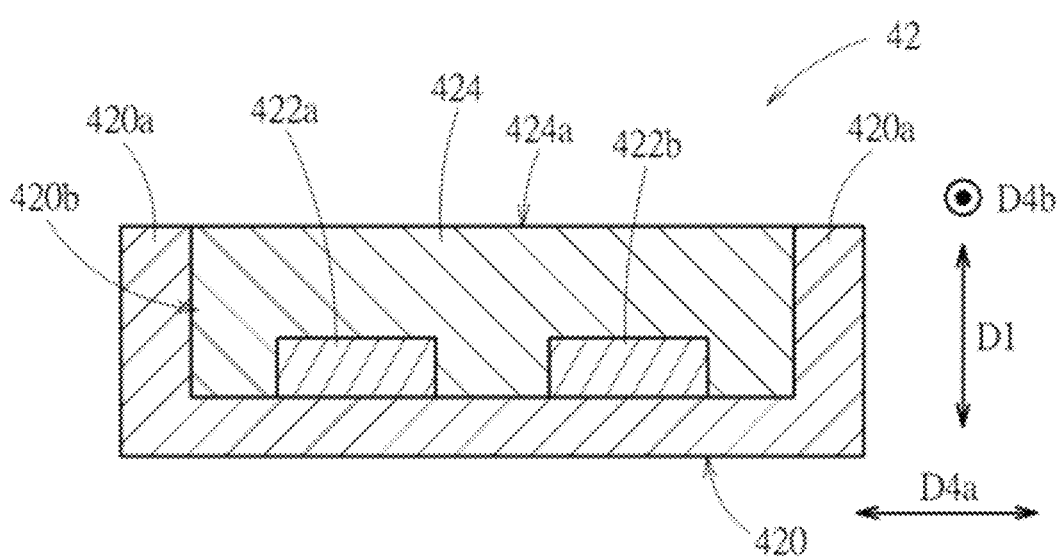
FIG. 15 is a sectional view of the light-emitting die package along the line W-W in FIG. 14.

In addition, in the above embodiments, the light-emitting dies 22a, 22b and 22c (or the light-emitting dies 22a', 22b' and 22c', or the light-emitting dies 22a", 22b" and 22c") may be packed together in the same package in practice, or individually packed. Furthermore, in the case of packaging multiple light-emitting dies in a single package, the single package can package three or more light-emitting dies. For example, please refer to FIG. 14 and FIG. 15. FIG. 14 is a schematic diagram illustrating a light-emitting die package 42 according to a first embodiment. FIG. 15 is a sectional view of the light-emitting die package along the line W-W in FIG. 14. The light-emitting die package 42 includes a carrier 420, a plurality of light-emitting dies (including three light-emitting dies 422a, 422b and 422c in the embodiment) disposed on the carrier 420, and a translucent package material 424 covering the plurality of light-emitting dies 422a, 422b and 422c (in which because the translucent package material 424 is light-transmitting, the profiles of the light-emitting dies 422a, 422b and 422c are shown in thin lines in FIG. 14). In the embodiment, the carrier 420 has side walls 420a on its periphery to form an accommodating space 420b. The light-emitting dies 422a, 422b and 422c are accommodated in the accommodating space 420b. The accommodating space 420b is filled with the translucent package material 424. The translucent package material 424 covers the light-emitting dies 422a, 422b and 422c. In practice, the carrier 420 may include a lead frame and a container joined with the lead frame (e.g., but not limited thereto, by injection molding). For simplification of drawings, the carrier 420 is shown by a simple structure in the figures. Taking the light-emitting die 422a as an example, the light-emitting die 422a has a top light-emitting surface 4222a and four side light-emitting surfaces 4224a. The light-emitting die 422a emits light from the top light-emitting surface 4222a and the side light-emitting surfaces 4224a. The light-emitting dies 422b and 422c are also the same, which will not be repeated in addition. Furthermore, the disposition distances between the light-emitting dies 422a, 422b and 422c depend on the actual manufacturing process, which will not be described in detail. For example, if mini-LEDs are used, the disposition distances can be hundreds of microns.

Furthermore, in the embodiment, the carrier 420 may be opaque. The carrier 420 can reflect light (e.g., using white material to make the carrier 420 or coating the inner side surfaces in the accommodating space 420b with a reflective layer, for increasing light reflection efficiency), or the white material may be partially reflective and semi-transparent by controlling the thickness of the white material. Both help to improve the light mixing effect (that is, to increase the uniformity of the light exiting the light-emitting die package 42 from the top surface 424a of the translucent package material 424). Furthermore, in the embodiment, light exits the light-emitting die package 42 from the top surface 424a of the translucent package material 424 roughly in the vertical direction D1. In practice, the carrier 420 may not include the protruding side walls 420a. For example, in FIG. 16, the carrier 420' is provided without protruding side walls, so that light can also be emitted out of the light-emitting die package 42 in horizontal directions D4a and D4b. Therein, the translucent package material 424' has exposed side surfaces 424b and 424c. The side surface 424b is parallel to the vertical direction D1 and the horizontal direction D4a. The side surface 424c is parallel to the vertical direction D1 and the horizontal direction D4b. Furthermore, the horizontal directions D4a and D4b are perpendicular to each other; however, it is not limited thereto in practice.

Figure 17:
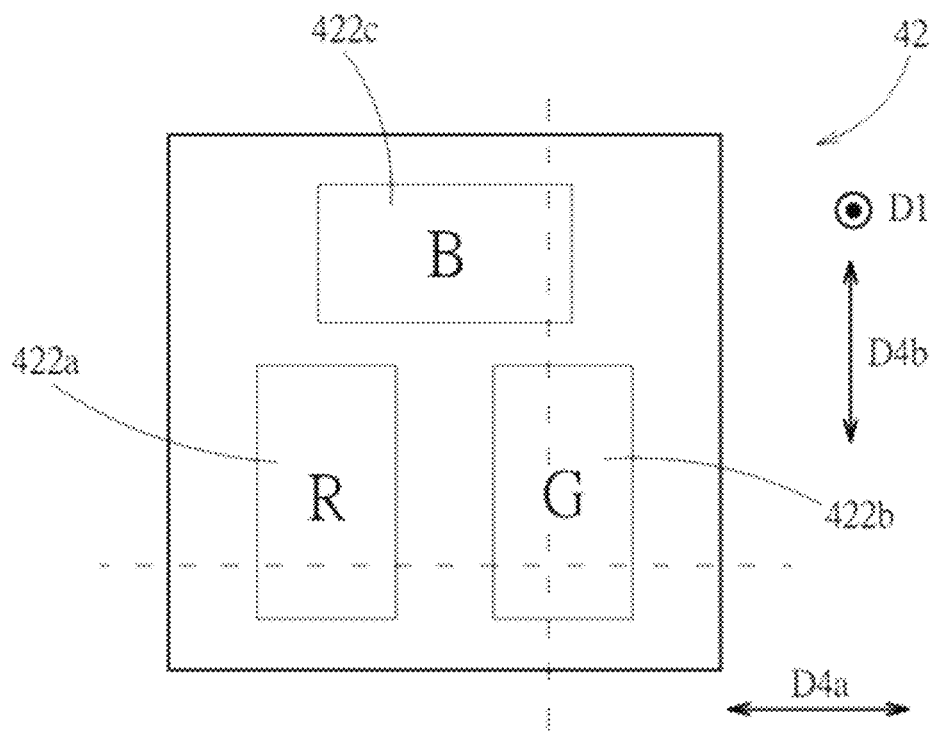
FIG. 17 is a schematic diagram illustrating a top view configuration of the light-emitting die package in FIG. 14.

For simplification of drawings, in FIG. 17 (which is a top view configuration of the light-emitting die package 42 (or 42')), the overall outline of the light-emitting die package 42 (or 42') is shown by a single thick box, and the light-emitting dies 422a, 422b and 422c thereof are shown by thin boxes, respectively. The colors of the light emitted by the light-emitting dies 422a, 422b and 422c are also indicated in the figure (e.g., red is indicated by the letter "R", green by the letter "G", blue by the letter "B"). As shown by FIG. 14 and FIG. 17, in the first embodiment, the light-emitting dies 422a, 422b and 422c are distributed in a plane and are monochromatic light-emitting dies. Therein, the light-emitting die 422a emits red light, the light-emitting die 422b emits green light, and the light-emitting die 422c emits green light. As shown by FIG. 17, in the light-emitting dies 422a, 422b and 422c, the two adjacent light-emitting dies 422a and 422b which are arranged in a first arrangement direction (i.e., the horizontal direction D4a) perpendicular to the vertical direction D1 (e.g., arranged along the horizontal dashed line in the drawing) emit light of different colors (red light and green light, respectively). In the light-emitting die package 42' (which has the exposed side surfaces 424b and 424c; on the contrary, in the light-emitting die package 42, the side surfaces of the translucent package material 424 are covered by the protruding side walls 420a), this disposition configuration makes the light emitted by the light-emitting die package 42 in a direction perpendicular to the horizontal direction D4a not only have a single color (based on the orientation of the drawing of FIG. 17, red light and green light can be directly received at the same time at the lower side of the light-emitting die package 42), which helps to reduce the degree of color deviation in this direction.

Similarly, the two adjacent light-emitting dies 422b and 422c which are arranged in a second arrangement direction (i.e., the horizontal direction D4b) perpendicular to the vertical direction D1 (e.g., arranged along the vertical dashed line in the drawing) emit light of different colors (green light and blue light, respectively). In the light-emitting die package 42', this disposition configuration makes the light emitted by the light-emitting die package 42 in a direction perpendicular to the horizontal direction D4a not only have a single color (based on the orientation of the drawing of FIG. 17, green light and blue light can be directly received at the same time at the right side of the light-emitting die package 42), which helps to reduce the degree of color deviation in this direction.

Figure 16:
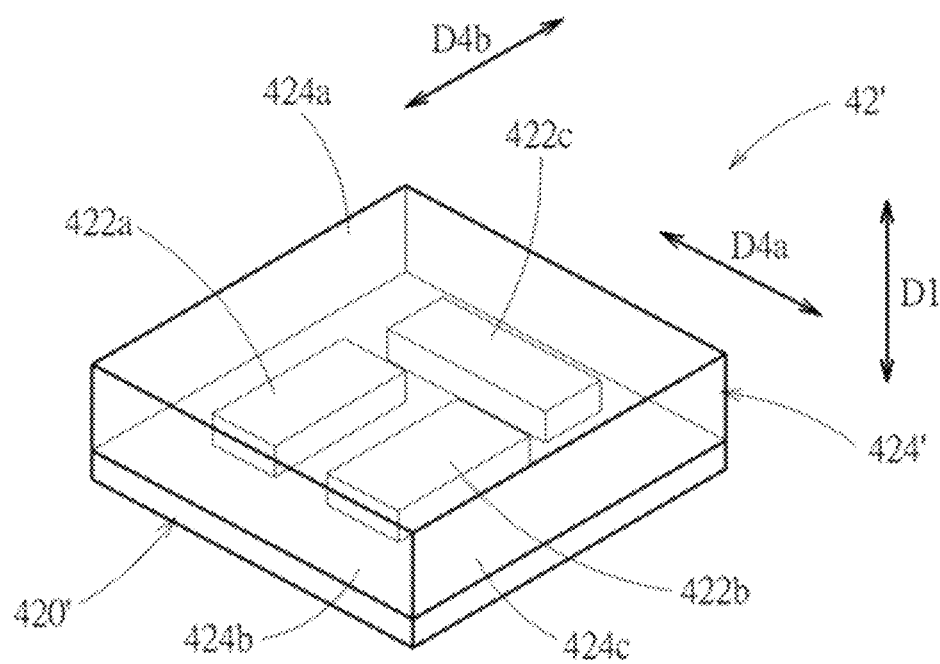
FIG. 16 is a schematic diagram illustrating a variation example of the light-emitting die package in FIG. 14.

As shown by FIG. 16, the light-emitting dies 422a and 422b are arranged closer to the side surface 424b of the light-emitting die package 42' than the other light-emitting die 422c. The light-emitting dies 422a and 422b have die edges 4226a and 4226b parallel to the side surface 424b, respectively. One side light-emitting surface 4224a of the light-emitting die 422a faces the same direction as the side surface 424b; the same is true for the light-emitting die 422b, which will not be repeated in addition. Furthermore, the above descriptions of the light-emitting die package 42' are also applicable to the light-emitting die package 42, and will not be repeated in addition.

Figures 18, 19:
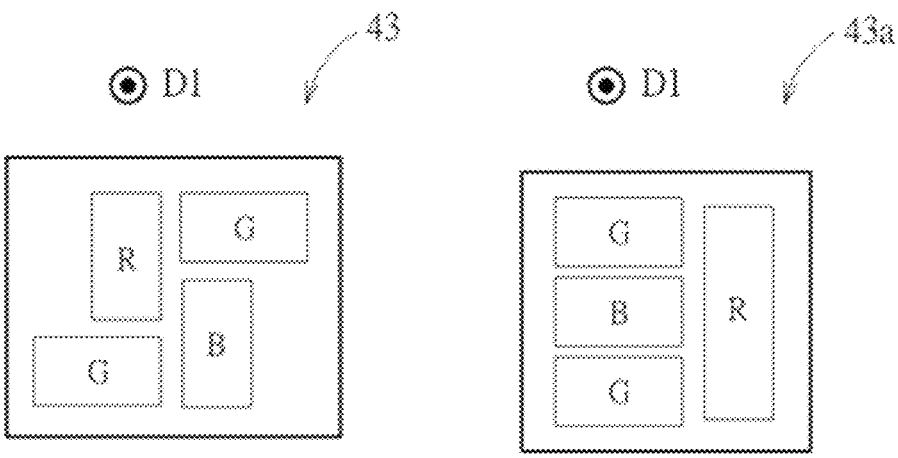
FIG. 18 is a schematic diagram illustrating a top view configuration of a light-emitting die package according to a second embodiment.
FIG. 19 is a schematic diagram illustrating a top view configuration of a light-emitting die package according to a third embodiment.

Furthermore, as shown by FIG. 17, the light-emitting dies 422a, 422b and 422c emit light of three colors (red, green and blue), the area of the top light-emitting surface corresponding to each color light is equal (in the embodiment, the top light-emitting surfaces of the light-emitting dies 422a, 422b and 422c are equal). However, in practice, the light-emitting die package 42 is not limited to including three light-emitting dies. Please refer to FIG. 18, which is a top view configuration of a light-emitting die package 43 according to a second embodiment. The light-emitting die package 43 includes four light-emitting dies, emitting green light, blue light, green light, and red light, respectively. The relevant descriptions of the aforementioned light-emitting die packages 42 and 42' are also applicable herein, where will not be repeated in addition. For another example, as shown by FIG. 19, a light-emitting die package 43a according to a third embodiment also includes four light-emitting dies, emitting green light, blue light, green light, and red light, respectively. Similarly, the relevant descriptions of the aforementioned light-emitting die packages 42 and 42' are also applicable herein, where will not be repeated in addition.

Figures 20, 21:
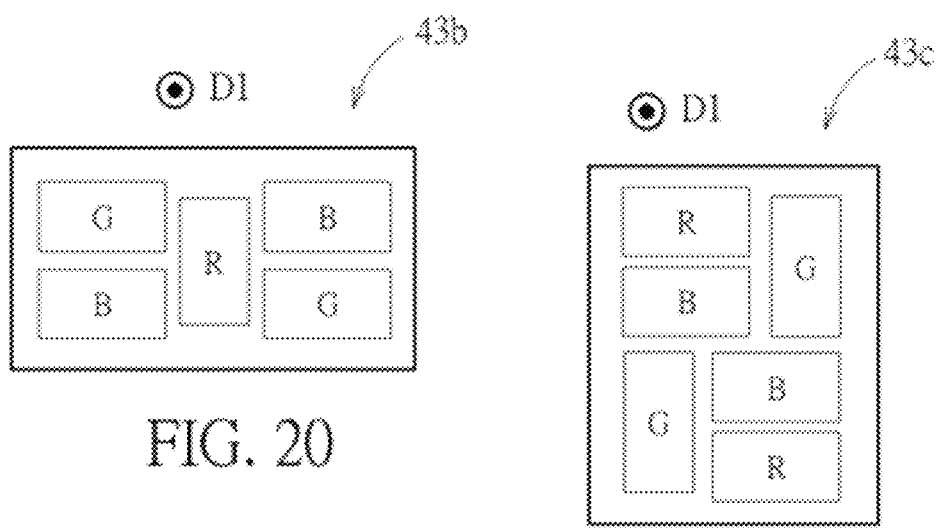
FIG. 20 is a schematic diagram illustrating a top view configuration of a light-emitting die package according to a fourth embodiment.
FIG. 21 is a schematic diagram illustrating a top view configuration of a light-emitting die package according to a fifth embodiment.

For another example, as shown by FIG. 20, a light-emitting die package 43b according to a fourth embodiment includes five light-emitting dies, emitting green light, blue light, red light, green light, and blue light, respectively. Similarly, the relevant descriptions of the aforementioned light-emitting die packages 42 and 42' are also applicable herein, where will not be repeated in addition.

For another example, as shown by FIG. 21, a light-emitting die package 43c according to a fifth embodiment includes six light-emitting dies, emitting green light, blue light, red light, green light, blue light, and red light, respectively. Similarly, the relevant descriptions of the aforementioned light-emitting die packages 42 and 42' are also applicable herein, where will not be repeated in addition.

For another example, as shown by FIG. 21, a light-emitting die package 43d according to a sixth embodiment includes eight light-emitting dies, emitting green light, red light, blue light, green light, red light, green light, blue light, and red light, respectively. Similarly, the relevant descriptions of the aforementioned light-emitting die packages 42 and 42' are also applicable herein, where will not be repeated in addition.

Furthermore, in the embodiment, the light-emitting dies of the light-emitting die package 43d are arranged in a rectangular ring. Any two adjacent light-emitting dies along the rectangular ring emit light of different colors.

Figure 22:
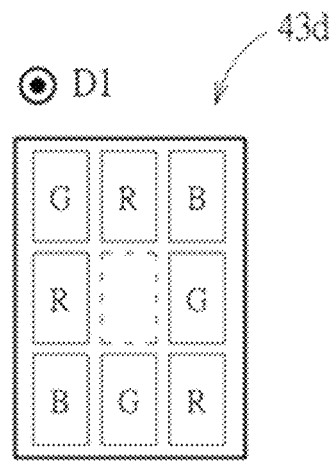
FIG. 22 is a schematic diagram illustrating a top view configuration of a light-emitting die package according to a sixth embodiment.

In the light-emitting die packages 42, 42', 43a, 43b, 43c and 43d of the above embodiments, each light-emitting die has at least one side facing outwards. For example, in the light-emitting die package 43d shown by FIG. 22 (based on the orientation of the drawing of FIG. 22), the right and upper sides of the right light-emitting die of blue light face outwards, the right side of the right light-emitting die of green light faces outwards, the right and lower sides of the right light-emitting die of red light face outwards, the upper side of the middle light-emitting die of red light faces outwards, the lower side of the middle light-emitting die of green light faces outwards, and so on. This configuration helps to improve the utilization of the light emitted by the light-emitting die package through its side surfaces. However, it is not limited thereto in practice. For example, a light-emitting die is also disposed at the location indicated by a dashed box in FIG. 22.

Figure 23:
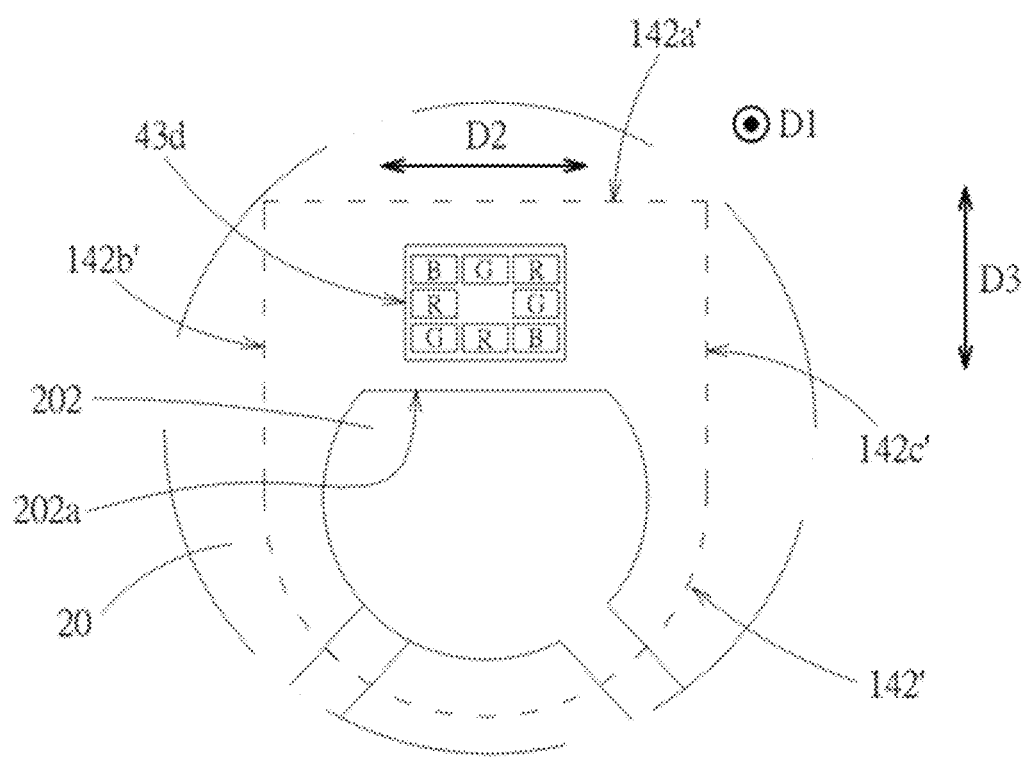
FIG. 23 is a top view configuration of FIG. 4A, in which the light-emitting dies are replaced by the light-emitting die package of the sixth embodiment.

In actual applications, the above light-emitting die packages 42, 42', 43a, 43b, 43c and 43d may directly replace the above light-emitting dies 22a, 22b and 22c, the above light-emitting dies 22a', 22b' and 22c' or the above light-emitting dies 22a", 22b", 22c" and be disposed in the illuminated keyswitch structures 1 and 3. For example, the light-emitting die package 43d (as shown by FIG. 19) replaces the light-emitting dies 22a, 22b and 22c (of the illuminated keyswitch structure 1) in FIG. 4A and is fixed on the light source circuit board 24 (also referring to FIG. 2). The top view configuration thereof is shown as FIG. 23; the sectional view thereof is shown as FIG. 24 (equivalent to the case that the light-emitting dies 22a, 22b and 22c in FIG. 3 are replaced with the light-emitting die package 43d). The circuitry (including the switch contact pads 202) of the switch circuit board 20 does not overlap with the light-emitting die package 43d. In the light-emitting die package 43d, some of the plurality of light-emitting dies (i.e., based on the orientation of the drawing of FIG. 17, the light-emitting die of blue light, the light-emitting die of green light, and the light-emitting die of red light on the lower side) are closer to the flat edge 202a of the switch contact pad 202 than the other light-emitting dies in the horizontal direction D3 (perpendicular to the vertical direction D1) and are arranged parallel to the flat edge 202a (i.e., arranged in the direction D2).

Figure 24:
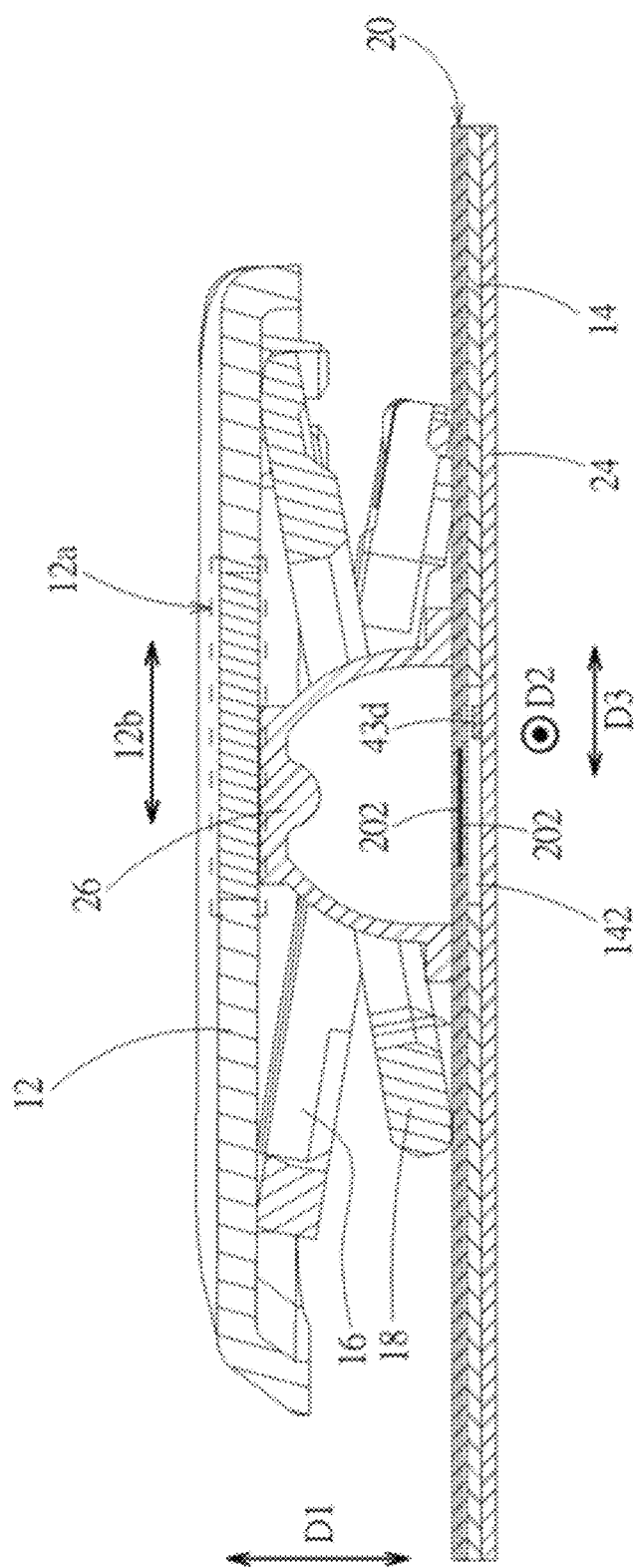
FIG. 24 is a sectional view of an illuminated keyswitch structure corresponding to FIG. 23.

Furthermore, as shown by FIG. 24, the light-emitting die package 43d is located in the through hole 142 of the base plate 14. The vertical projections of the switch contact pad 202 and the light-emitting die package 43d on the base plate 14 are located within the through hole 142. The light-emitting die package 43d is not higher than an upper surface 142c of the base plate 14 in the vertical direction D1 (that is, the top surface of the light-emitting die package 43d (e.g., the top surface 424a of the translucent package material 242, referring to FIG. 14 or FIG. 15) is lower than or equal to the upper surface 142c).

In this embodiment, the through hole 142 (as shown by FIG. 2) is circular; however, it is not limited thereto. For example, in a variation example of the through hole 142, part of the arc edge of the through hole 142' (the profile projection of which is shown in dashed lines in FIG. 23) of the base plate 14 is parallel to the arc edge of the switch contact pad 202, and at the other side of the through hole 142, three edges are perpendicular to each other, thereby constituting a bullet-shaped through hole as a whole. Therein, based on the orientation of the drawing of FIG. 23, the adjacent light-emitting dies on the left side of the light-emitting die package 43d (i.e., the light-emitting die of blue light, the light-emitting die of red light, and the light-emitting die of green light) are closer to the hole edge 142b' than the other light-emitting dies in a horizontal direction (equivalent to the direction D2) perpendicular to the vertical direction D1 and are arranged parallel to the straight hole edge 142b' (i.e., arranged in the direction D3, or arranged perpendicular to the straight hole edge 142a'). Thereby, the hole edge 142b' has similar shading conditions for each of the light-emitting dies on the left of the light-emitting die package 43d, which helps to reduce the influence of the hole edge 142b' on the uniformity of the backlight provided by the light-emitting die package 43d. For the straight hole edges 142a' and 142c', the light-emitting die package 43d also has the light-emitting dies that are adjacent to the straight hole edges 142a' and 142c' and are arranged parallel to the straight hole edges 142a' and 142c', which will not be described in addition.

Figure 25:
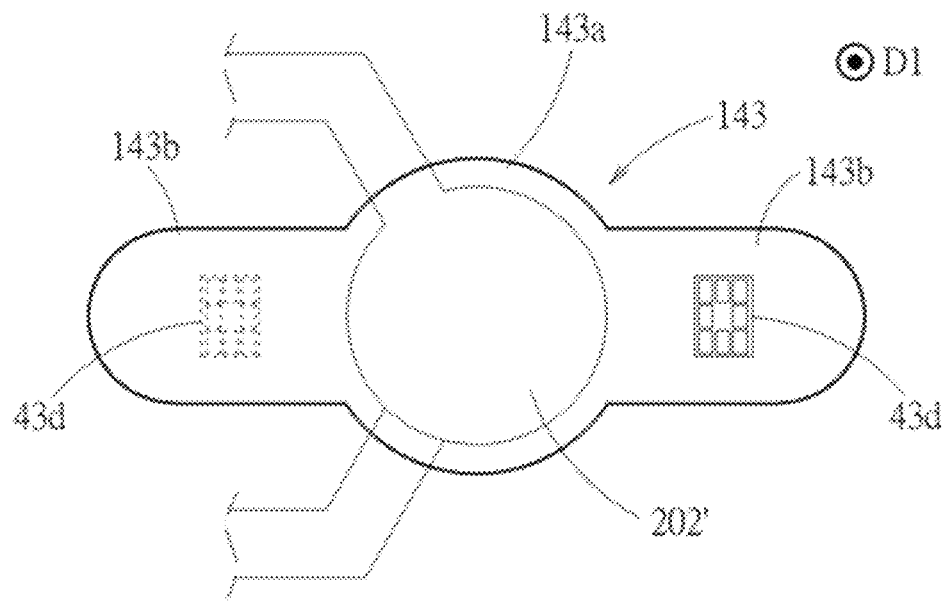
FIG. 25 is a schematic diagram illustrating a top view configuration of the switch circuit board and the light-emitting die package on the base plate in a variation example of the through hole.

For another example, in a variation example of the through hole 142, as shown by FIG. 25, the through hole 143 (the profile of which is shown in bold lines in the figure) of the base plate 14 includes a main hole portion 143a and two extension portion 143b extending from two sides of the main hole portion 143a. The vertical projection (shown in thin lines in the figure) of the switch contact pad 202' on the base plate 14 is located within the main hole portion 143a. The vertical projection (shown in thin lines in the figure) of the light-emitting die package 43d on the base plate 14 is located within one of the extension portions 143b. In the embodiment, another light-emitting die package 43d (shown in dashed lines in the figure) is disposed according to the other extension portions 143b. Thereby, the switch contact pad 202' also can avoid covering the light-emitting die package 43d directly. In addition, the two extension portions 143b are arranged at 180 degrees; however, it is not limited thereto in practice. For example, the two extension portions 143b can be arranged at 120 degrees (logically, this still belongs to the arrangement on both sides of the main hole part 143).

Figure 26:
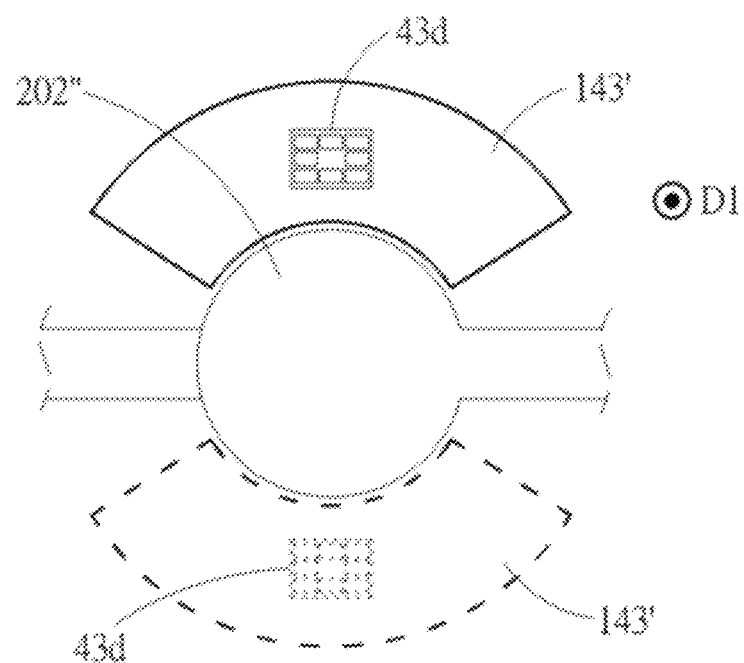
FIG. 26 is a schematic diagram illustrating a top view configuration of the switch circuit board and the light-emitting die package on the base plate in another variation of the through hole.

For another example, in a variation example of the through hole 142, as shown by FIG. 26, the base plate 14 has a through hole 143' (the profile of which is shown in bold lines in the figure). The vertical projection (shown in thin lines in the figure) of the switch contact pad 202" on the base plate 14 is located outside the through hole 143' and beside the through hole 143'. The vertical projection (shown in thin lines in the figure) of the light-emitting die package 43d on the base plate 14 is located within the through hole 143'. Thereby, the switch contact pad 202" also can avoid covering the light-emitting die package 43d directly. Furthermore, the through hole 143' is a circular sector and (in the view point of FIG. 26) extends along the inner edge of the through hole 143'. In addition, in practice, it is practicable to dispose another through hole 143' (shown in dashed lines in the figure), and another light-emitting die package 43d (shown in dashed lines in the figure) is also disposed according to this through hole 143'. Furthermore, in practice, the central angle corresponding to the circular sector is not limited to the case shown in the figure that is less than 180 degrees. The two through holes 143' are not limited to configurations with the same profile and symmetrical disposition. In the embodiment, the through hole 143' is disposed to avoid the circuitry layout, so the through holes 143' may be formed in a single C-shaped profile in practice (for example, modify the leads of the switch contact pad 202" in the figure so that they are on the same side); however, it is not limited thereto in practice. Furthermore, in practice, the profile of the through hole 143' is not limited to a circular sector.

Figure 27:
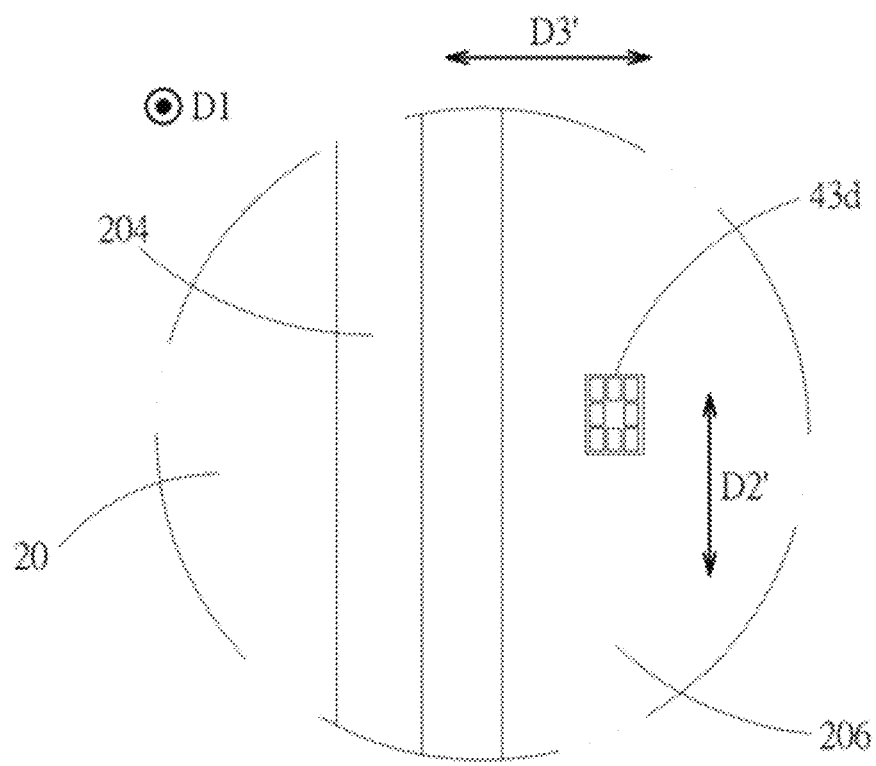
FIG. 27 is a top view configuration of FIG. 8, in which the light-emitting dies are replaced by the light-emitting die package of the sixth embodiment.

In the foregoing, as shown by FIG. 8, the light-emitting dies 22a, 22b and 22c and the trace segment 204 are staggered (i.e., not overlapping in the vertical direction D1). Similarly, in actual applications, the light-emitting dies 22a, 22b and 22c may be replaced with the light-emitting die package 43d, as shown by FIG. 27. The trace segment 204 extends straight. In the light-emitting die package 43d, some of the light-emitting dies (i.e., based on the orientation of the drawing of FIG. 27, the left light-emitting die of green light, the left light-emitting die of red light, the left light-emitting die of blue light (e.g. referring to FIG. 22)) that are closer to the trace segment 204 than the other light-emitting dies in the horizontal direction D3' (perpendicular to the vertical direction D1) are arranged parallel to and near to the trace segment 204 (i.e., arranged in the direction D2). The relevant descriptions about FIG. 8 and FIG. 9 in the foregoing are also applied herein if they are applicable, where will not be repeated in addition.

Figure 28:
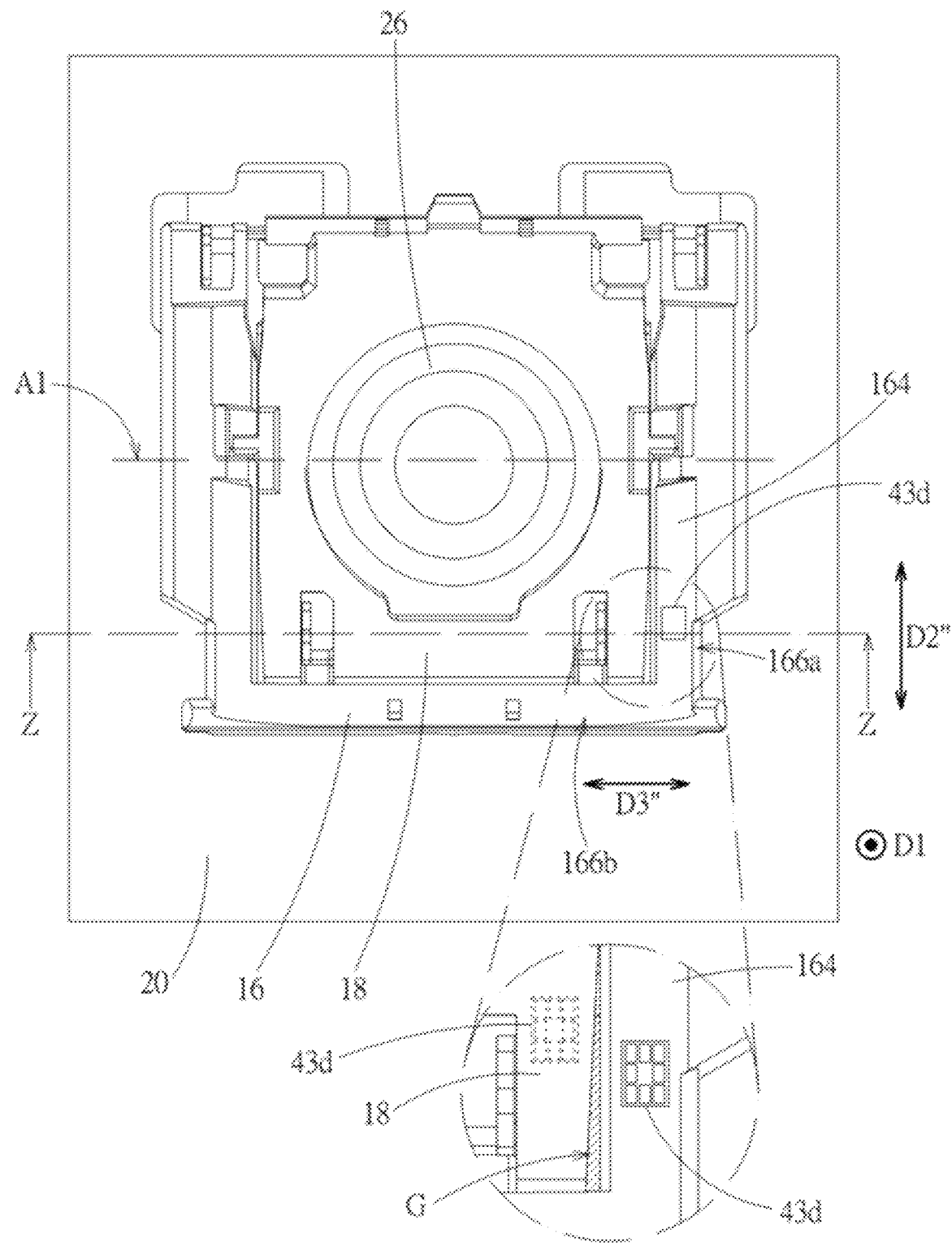
FIG. 28 is a top view configuration of FIG. 11A, in which the light-emitting dies are replaced by the light-emitting die package of the sixth embodiment.

In the foregoing, as shown by FIG. 11A, the light-emitting dies 22a, 22b and 22c are located under one of the supports (e.g., the first support 16). In actual applications, the light-emitting dies 22a, 22b and 22c may be replaced with the light-emitting die package 43d, as shown by FIG. 28. In the light-emitting die package 43d, some of the light-emitting dies (i.e., based on the orientation of the drawing of FIG. 28, the left light-emitting die of green light, the left light-emitting die of red light, the left light-emitting die of blue light (e.g. referring to FIG. 22)) that are closer to the gap projection G (which has a lengthwise direction equivalent to the direction D2"; the gap projection G extends roughly in the lengthwise direction) than the other light-emitting dies in a horizontal direction D3" perpendicular to the vertical direction D1 are arranged parallel to the lengthwise direction and have a die edge (e.g., the left edges of the above light-emitting dies) parallel to the lengthwise direction. Thereby, the gap projection G has similar shading conditions for each of the light-emitting dies on the left of the light-emitting die package 43d, which helps to reduce the influence of the gap projection G on the uniformity of the backlight provided by the light-emitting die package 43d. Furthermore, in the embodiment, the light-emitting die package 43d is completely below the first support 16, so that the light emitted by each light-emitting die in the light-emitting die package 43d can travel in a similar path, thereby reducing the degree of color deviation that may occur after the light passes through the first support 16. The relevant descriptions about FIG. 11A in the foregoing are also applied herein if they are applicable, where will not be repeated in addition. For example, the light-emitting die package 43d can be changed to be disposed under the second support 18 (e.g., the light-emitting die package 43d shown in dashed lines in the figure).

Figure 29:
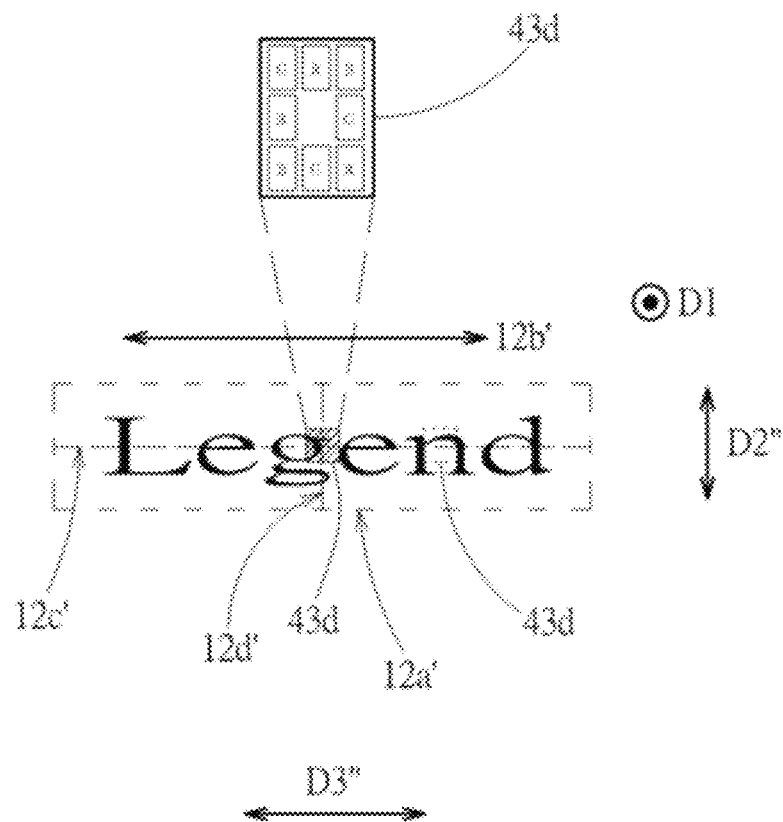
FIG. 29 is a top view configuration of FIG. 13B, in which the light-emitting dies are replaced by the light-emitting die package of the sixth embodiment.

In the foregoing, as shown by FIG. 7, FIG. 13A and FIG. 13B, the light-emitting dies 22a, 22b and 22c as a whole overlaps with the permeable indicator areas 12a and 12a' in the vertical direction D1. In actual applications, the light-emitting dies 22a, 22b and 22c may be replaced with the light-emitting die package 43d. As shown by FIG. 29, the permeable indicator area 12a' is rectangular and thereon defines a long axis 12c' and a short axis 12d' (indicated by chain lines in the figure). The long axis 12c' is parallel to the lengthwise direction 12b'. The short axis 12d' is perpendicular to the lengthwise direction 12b' (and also parallel to the direction D2"). The geometric center of the permeable indicator area 12a' (equivalent to the intersection of the long axis 12c' and the short axis 12d') overlaps with the light-emitting die package 43d in vertical direction D1 (or the geometric center falls within the range of light-emitting die package 43d). Furthermore, in the embodiment, the geometric center of the permeable indicator area 12a' coincides with the geometric center of the light-emitting die package 43d; however, it is not limited thereto in practice. For example, the geometric center of the light-emitting die package 43d deviates from the geometric center of the permeable indicator area 12a', referring to the light-emitting die package 43d shown in dashed lines in the figure. Therein, in this case, the vertical projection of the whole light-emitting die package 43d still falls within the extent of the permeable indicator area 12a'; however, it is not limited thereto in practice. For example, the vertical projection of the whole light-emitting die package 43d exceeds the extent of the permeable indicator area 12a' (e.g., in FIG. 13A, both vertical projections of the light-emitting dies 22a and 22c are beyond the extent of the permeable indicator area 12a', so that the vertical projection of the light-emitting dies 22a, 22b and 22c as a whole partially exceeds the extent of the permeable indicator area 12a'). Furthermore, in the embodiment, the permeable indicator area 12a' includes a plurality of permeable characters (e.g. "Legend" in the figure) arranged along the lengthwise direction 12b'. In the light-emitting die package 43d, the die edges of the light-emitting dies are parallel to or perpendicular to the lengthwise direction 12b' (for example, for the light-emitting die of green light in the upper left corner, its upper and lower side edges are parallel to the lengthwise direction 12b' (i.e., parallel to the long axis 12c'), and its left and right side edges are perpendicular to the lengthwise direction 12b'). The relevant descriptions about FIG. 7, FIG. 13A and FIG. 13B in the foregoing are also applied herein if they are applicable, where will not be repeated in addition.

The foregoing is described with the light-emitting die package 43d replacing the light-emitting dies 22a, 22b and 22c as an example. In principle, the light-emitting die packages 42, 42', 43a, 43b, 43c and 43d can also be used to replace the above light-emitting dies 22a, 22b and 22c, the above light-emitting dies 22a', 22b' and 22c', or the above light-emitting dies 22a", 22b" and 22c" and be applied to each of the above embodiments, which will not be further described in detail.

Figure 30:
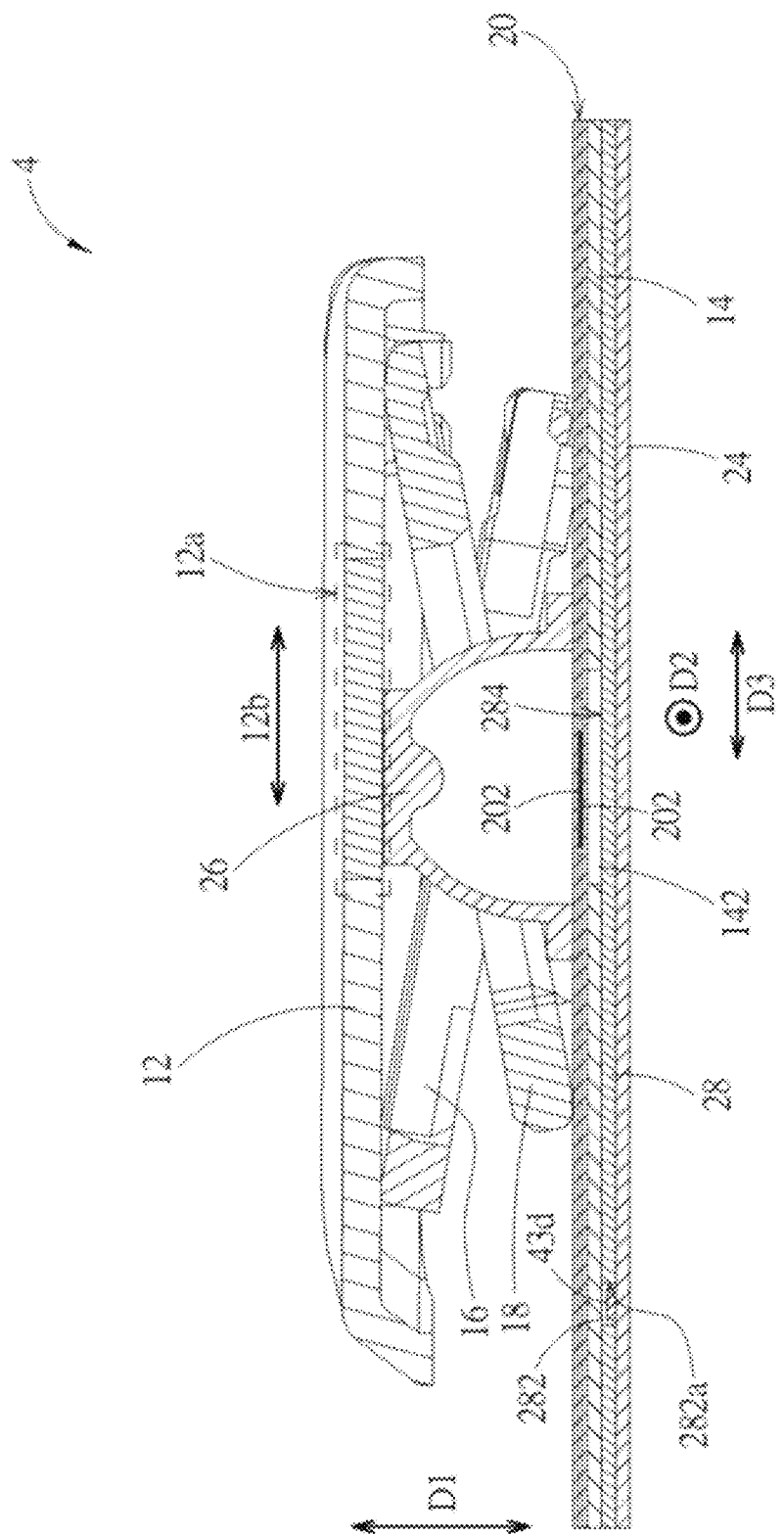
FIG. 30 is a sectional view of an illuminated keyswitch structure according to an embodiment.

In addition, in practice, the above embodiments may be provided with a light-guiding sheet to guide and mix light emitted by the light-emitting die packages 42, 42', 43a, 43b, 43c and 43d and the light-emitting dies 22a, 22b, 22c, 22a', 22b', 22c', 22a", 22b" and 22c". Please refer to FIG. 30. An illuminated keyswitch structure 4 shown by FIG. 30 is similar to the illuminated keyswitch structure 1, so the illuminated keyswitch structure 4 follows the component symbols of the illuminated key switch structure 1. For other descriptions about the illuminated keyswitch structure 4, please refer to the relevant descriptions of the illuminated keyswitch structure 1 and variations thereof in the foregoing, which will not be repeated in addition. A main difference between the illuminated keyswitch structure 4 and the illuminated keyswitch structure 1 is roughly that the illuminated keyswitch structure 4 further includes a light-guiding sheet 28 that is disposed under the base plate 14. The light-guiding sheet 28 has an accommodating recess 282 (e.g., realized by a through hole). The light-emitting die package 43d (or other light-emitting die packages 42, 42', 43a, 43b and 43c) is located in the accommodating recess 282, so that the light emitted by the light-emitting die package 43d enters the light-guiding sheet 28 from an inner wall surface 282a of the accommodating recess 282. The light entering the light-guiding sheet 28 can leave the light-guiding sheet 28 from an upper surface 284 of the light-guiding sheet 28. As shown by FIG. 30, the base plate 14 does not cover the light-guiding sheet 28 at its through hole 142, so the light can illuminate the keycap 12 upwards through the through hole 142. In terms of structural properties, the base plate 14 has an opaque effect in principle, and therefore can be used as a mask layer at the same time. In addition, in the embodiment, the projection of the switch contact pad 202 of the switch circuit board 20 on the base plate 14 is also located within the through hole 142; however, it is not limited thereto in practice. For example, the switch contact pad 202 is moved to another place (away from the through hole 142) or there is also a physical structure of the base plate 14 under the switch contact pad 202, so that the light exiting from the upper surface 284 of the light-guiding sheet 28 will not directly irradiate the switch contact pad 202, which helps to reduce the possible influence of the light reflected by the circuitry of the circuit board 20 (e.g., the color of the reflected light is changed).

Figure 31:
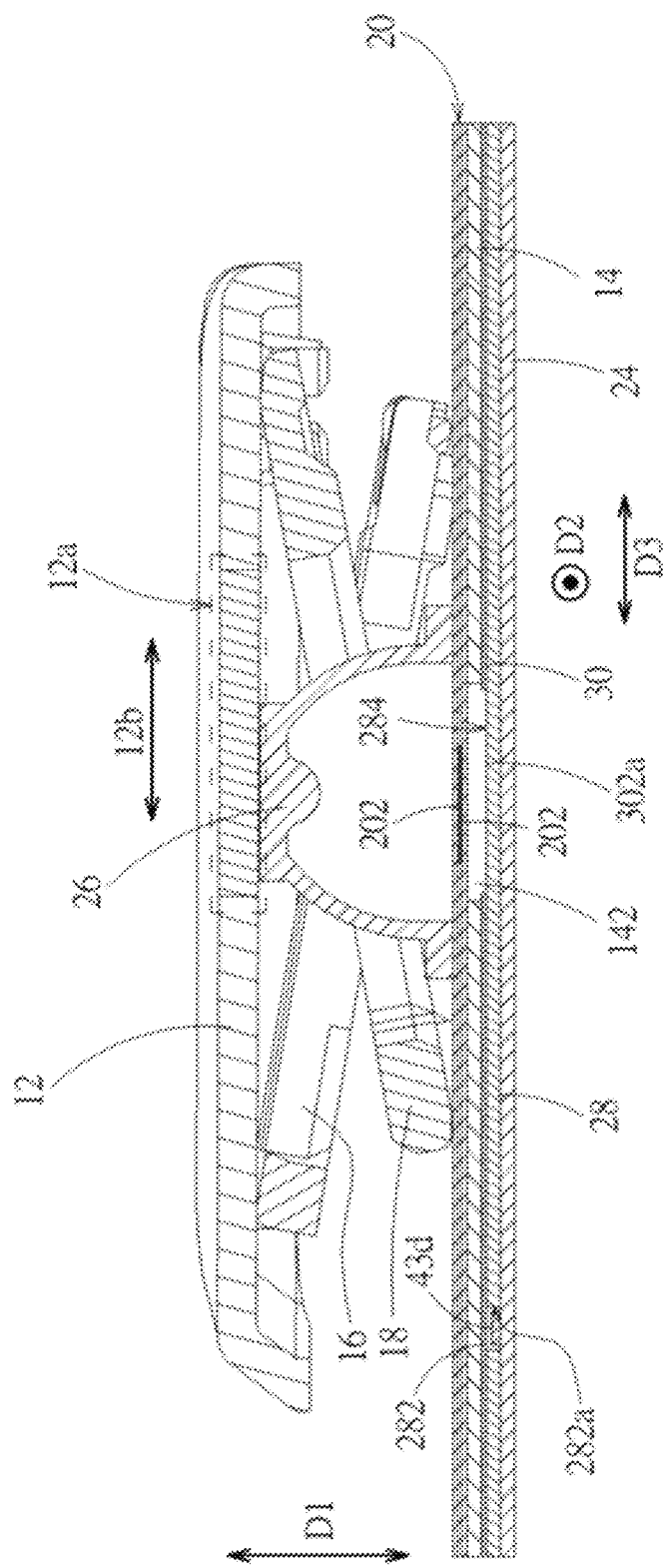
FIG. 31 is a sectional view of the illuminated keyswitch structure in FIG. 30 further with a mask layer.

Furthermore, in practice, a mask layer 30 may be disposed on the upper surface 284 of the light-guiding sheet 28, for a shielding design for the light-guiding sheet 28, as shown by FIG. 31. In practice, the mask layer 30 can be realized by an opaque thin sheet disposed right above the light-emitting die package 43d. The mask layer 30 covers the accommodating recess 282 (together with the light-emitting die package 43d accommodated therein) and forms a permeable area 302a at the desired area (e.g. by making holes on this thin sheet), e.g. corresponding to the through hole 142. The quantity and profile of the permeable area 302a can be designed according to product requirements, without being troubled by the structural design of the base plate 14 itself (such as the light leakage caused by the hollow structure for forming the connection structure of the supports). In the embodiment, the vertical projection of the permeable area 302a on the base plate 14 is located within the through hole 142. In addition, in practice, the accommodating recess 282 is not limited to a through hole. For example, the accommodating recess may be realized by a blind hole or recess. In this case, the accommodating recess opens downwards, and will not communicate with the upper surface 284. The mask layer 30 may be realized by an opaque coating layer coated on the upper surface 284 (e.g., but not limited to, by printing).

Figure 32:
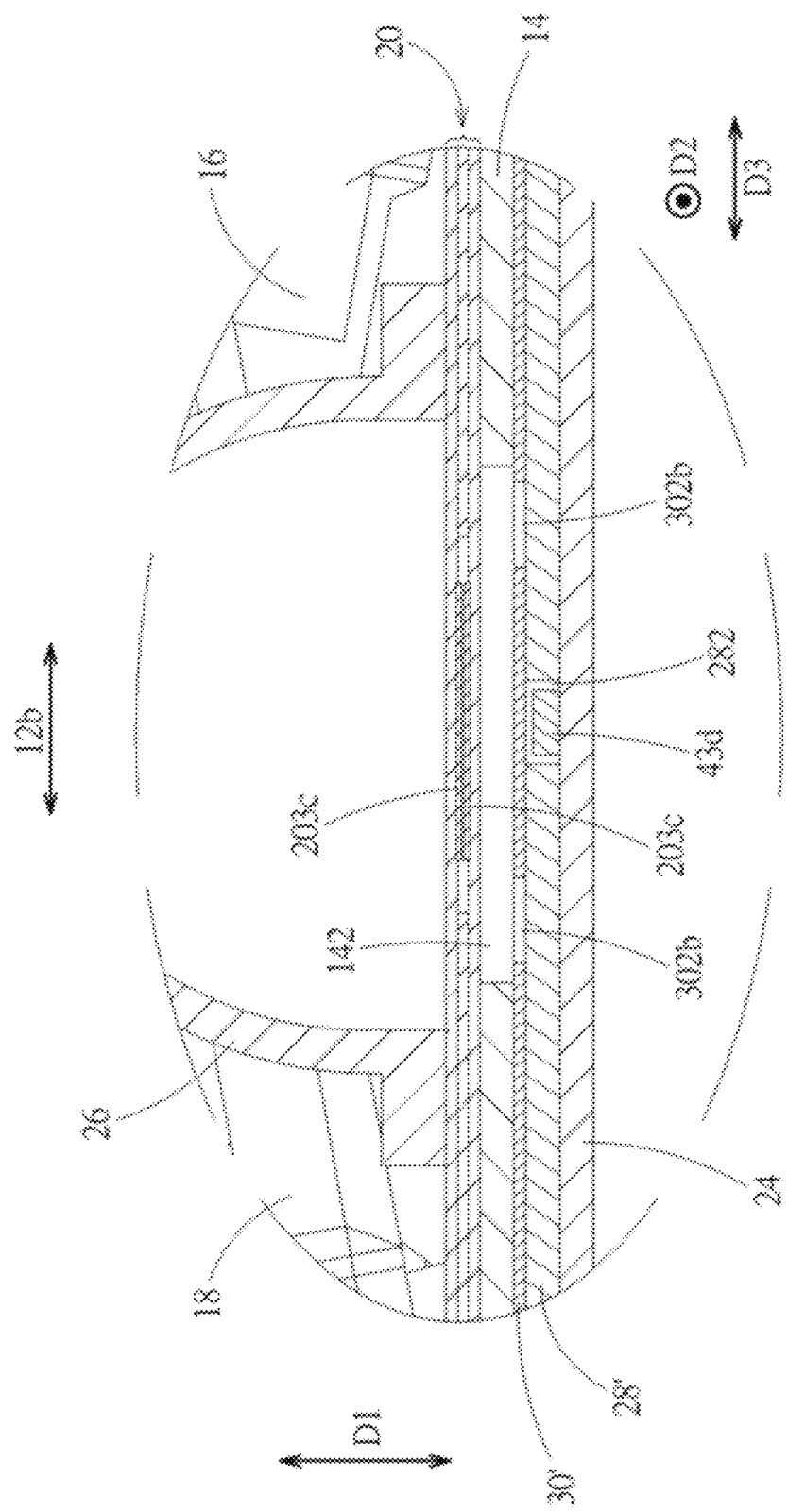
FIG. 32 is a sectional view of a variation example of the illuminated keyswitch structure in FIG. 31.
Figure 33:
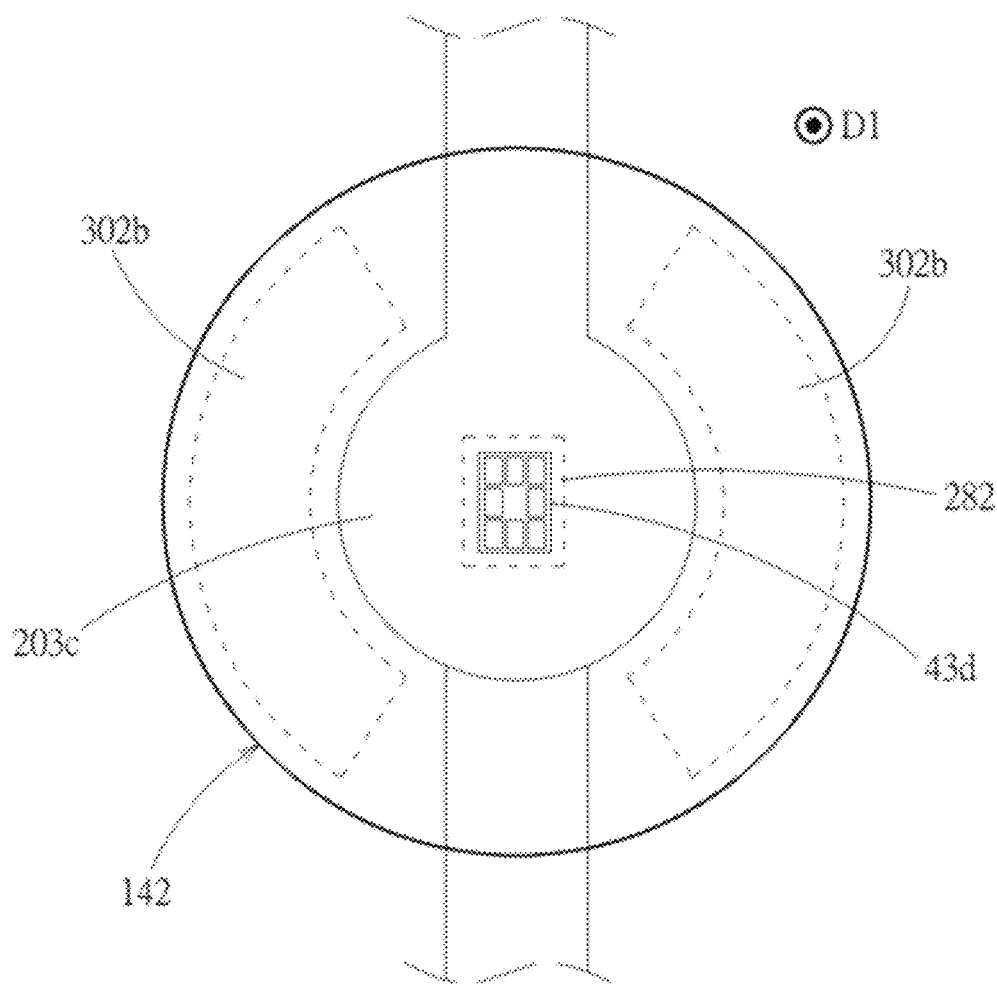
FIG. 33 is a top view configuration of the switch contact pad, the light-emitting die package, and the permeable area of the mask layer on the base plate in FIG. 32.

Please refer to FIG. 32 and FIG. 33; therein, in FIG. 33, the profile of the switch contact pad 203c is shown in thin lines, the profile of the light-emitting die package 43d is shown by a bold frame, and the profile of the accommodating recess 282 of the light-guiding sheet 28' and the profile of the permeable areas 302b of the mask layer 30' are shown in dashed lines. In this example, the vertical projections of the switch contact pad 203c, the accommodating recess 282 of the light-guiding sheet 28' (together with the light-emitting die package 43d), and the permeable area 302b of the light-guiding sheet 28' on the base plate 14 are located in the through hole 142. Furthermore, the light-emitting die package 43d is located under the switch contact pad 203c. On the other hand, the switch contact pad 203c and the light-emitting die package 43d overlap in the vertical direction D1. The permeable areas 302b of the mask layer 30' are disposed on the periphery of the projection of the light-emitting die package 43d on the mask layer 30'. In the embodiment, the permeable area 302b is a circular sector (as shown by FIG. 33) and extends around the projection of the light-emitting die package 43d on the mask layer 30'. In the embodiment, the permeable area 302b also extends around the projection of the switch contact pad 203c on the mask layer 30'; the permeable area 302b extends roughly beside the projection of the switch contact pad 203c on the mask layer 30'. Furthermore, in practice, the central angle corresponding to the circular sector is not limited to the case shown in the figure that is less than 180 degrees. The two permeable areas 302b are not limited to configurations with the same profile and symmetrical disposition. In the embodiment, the permeable area 302b is disposed to avoid the circuitry layout, so the permeable areas 302b may be formed in a single C-shaped profile in practice (for example, modify the leads of the switch contact pad 203c in the figure so that they are on the same side); however, it is not limited thereto in practice. Furthermore, in practice, the profile of the permeable area 302b is not limited to a circular sector. On the other hand, a vertical projection of an opaque portion of the mask layer 30 on the base plate 14 at least partially falls within the through hole 142. For example, as shown by FIG. 32, a portion of the mask layer 30 above the light-emitting die package 43d (which may be defined as an impermeable area of the mask layer 30) falls within the through hole 142. For another example, as shown by FIG. 32, a left portion of the mask layer 30 (which may be defined as another impermeable area of the mask layer 30) forms a portion of the profile of the permeable area 302b; the vertical projection of the left portion on the base plate 14 partially falls within the through hole 142.

Figure 34:
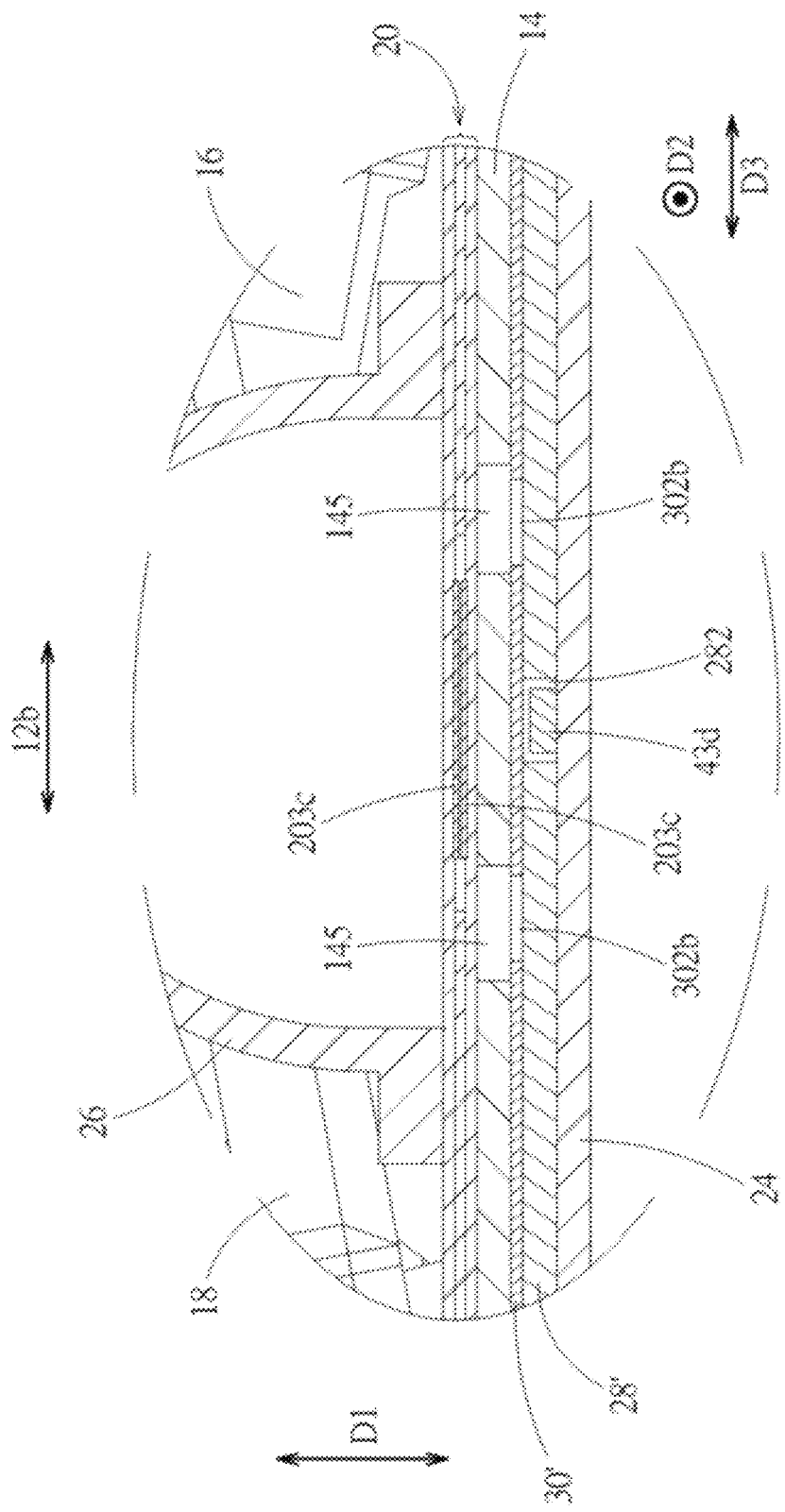
FIG. 34 is a sectional view of an illuminated keyswitch structure corresponding to FIG. 33.

In addition, in the embodiment, in practice, there may also be a physical structure of the base plate 14 between the switch contact pad 203c and the mask layer 30', for providing structural support for the switch contact pad 203c, as shown by FIG. 34. In this embodiment, the base plate 14 forms a through hole 145 corresponding to the permeable area 302b to expose the corresponding permeable area 302b. In practice, the through hole 145 may be (but is not limited to) a circular sector and similar in profile to the permeable area 302b. The vertical projection of the switch contact pad 203c on the base plate 14 is located outside the through hole 145 and beside the through hole 145.

Generally, light mixing effect depends on the configurations of different colors light-emitting dies included within a light-emitting die package. However, it is also applicable when applying to the orientations and alignments of similar-colored light-emitting dies.

Figure 35:
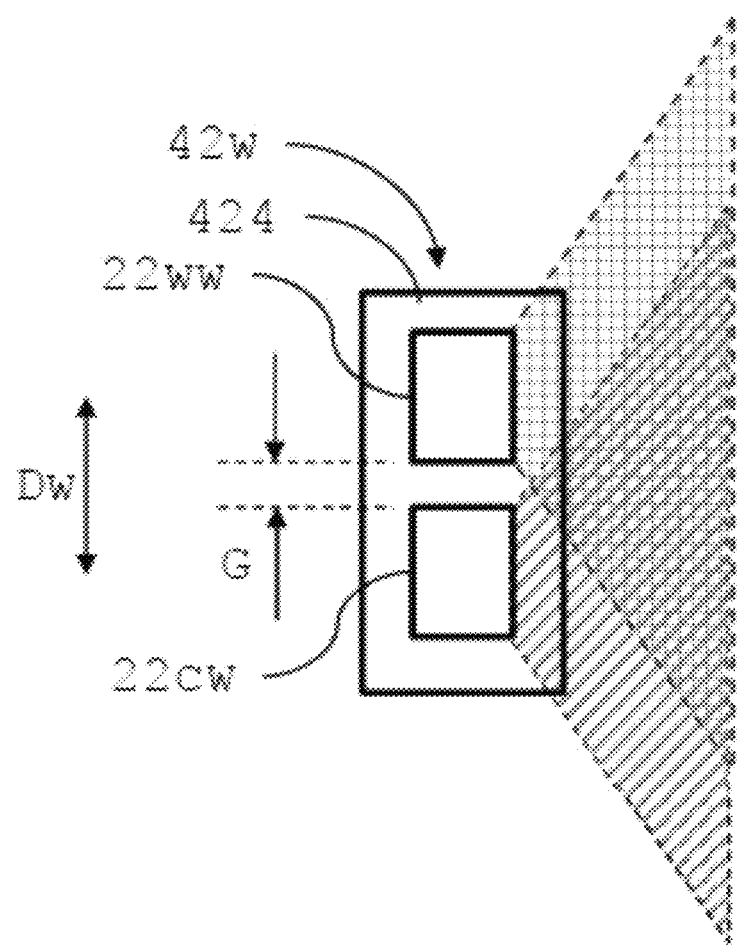
FIG. 35 is a top view of an alternative example for a light-emitting die package with two similar-colored light-emitting dies.

Please refer to FIG. 35, which is a top view of an alternative example for a light-emitting die package 42w with similar-colored light-emitting dies 22ww and 22cw. Both of the light-emitting dies 22ww and 22cw emit white lights and are mutually packaged by translucent package material 424 to integrally form the light-emitting die package 42w. The minor difference is that the light-emitting die 22ww provides warmer white lights to human eyes, while the light-emitting die 22cw provides colder white lights to human eyes. For example, the light-emitting die 22ww includes yellow light at around 600 nm to make human eyes feel warmer. On the other hand, the light-emitting die 22cw may include blue lights at about 445 nm. When either of the light-emitting dies 22cw and 22ww is independently emitting white lights, only two colors of white lights are able to be introduced to human eyes. Therefore, the light-emitting dies 22cw and 22ww may be powered at the same time but with different currents to adjust the warmer/colder color temperature for the human eyes.

How the light-emitting die package 42w have the similar-colored light-emitting dies 22ww and 22cw configured therein, decides how the mixing effects of the cold/warm white lights. In FIG. 35, the light-emitting dies 22ww and 22cw are aligned so that the short sides of the light-emitting dies 22ww and 22cw are located in parallel and corresponded to each other with a gap G there in between. The long sides of light-emitting dies 22ww and 22cw are also aligned together along the arrangement direction Dw, namely both the two long sides of the light-emitting dies 22ww and 22cw are facing the same direction and configured proximate to each other. Besides, the long sides of the light-emitting die package 42w and its light-emitting dies 22ww and 22cw are corresponded each other in parallel. And the short sides of the light-emitting die package 42w and its light-emitting dies 22ww and 22cw are configured in correspondence to each other and aligned in parallel. Such arrangement is to achieve a larger overlapping illuminated area for the adjacent light-emitting dies 22ww and 22cw because the long sides of the light-emitting dies 22ww and 22cw emit more lights. Therefore, highly-uniformed white lights with adjustable warmer/colder color temperature for human eyes may be produced by the structures and arrangements of the light-emitting dies 22ww and 22cw inside the light-emitting die package 42w in FIG. 35. Alternatively, same effect is still achievable if the light-emitting die 22ww emits a warmer color temperature lights (white or other than white) and the light-emitting die 22cw emits a colder color temperature lights (other than white or white). A warmer color temperature light means longer-wavelength warm color light is included, while a colder temperature light means longer-wavelength warm color light is included.

If the light-emitting dies 22ww and 22cw are aligned along their short sides (namely short sides arranged in parallel to the arrangement direction Dw), the overlapping of the lights from the short sides of the light-emitting dies 22ww and 22cw would be much less than what can be perfectly mixed through same arrangement of long sides of the light-emitting dies 22ww and 22cw.

Furthermore, the light-emitting die package 42w is applicable to all embodiments mentioned above. Namely the light-emitting die packages 42, 42', 43, 43a, 43b, 43c, 43d as disclosed in all the illuminated keyswitch structure 1, 3, 4 for the above embodiments and drawings, may be alternatively replaced by the light-emitting die package 42w shown in FIG. 35.

Moreover, the gap G between the two light-emitting dies 22cw and 22ww is configured not greater than the short sides of the light-emitting dies 22cw and 22ww, so as to achieve a better warm-cold light mixing effects. In other examples, the light-emitting die package 42w may be configured at least partially outside the vertical projection of the keycap 12 mentioned above. The light-emitting dies 22ww and 22cw may be powered to produce lights simultaneously for light mixing, or to produce lights independently once at a time.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. An illuminated keyswitch structure, comprising:
   a base plate;
   a keycap, movably disposed above the base plate in a vertical direction; and
   a light-emitting die package, disposed to illuminating the keycap through the base plate, the light-emitting die package comprising a warm color temperature light-emitting die and a cold color temperature light-emitting die, and the light-emitting die package extends along an arrangement direction;
   wherein each of the two light-emitting dies has a short side arranged adjacent to each other, with a long side of each of the two light-emitting dies facing a same direction and configured proximate to each other;
   wherein a gap between the two adjacent short sides of the two light-emitting dies is not greater than either one of the two adjacent short sides of the two light-emitting dies.

2. The illuminated keyswitch structure according to claim 1, wherein the light-emitting die package comprises a translucent package material that covers the two light-emitting dies.

3. The illuminated keyswitch structure according to claim 1, wherein the two adjacent long sides of the two light-emitting dies are arranged in parallel to a long side of the light-emitting die package.

4. The illuminated keyswitch structure according to claim 1, wherein the light-emitting die package comprises a carrier, the carrier has side walls to form an accommodating space, and the two light-emitting dies are accommodated in the accommodating space.

5. The illuminated keyswitch structure according to claim 1, wherein the warm color temperature light-emitting die is a white light-emitting die at least partially produces yellow light, and the cold color temperature light-emitting die is another white light-emitting die at least partially produces blue light.

6. The illuminated keyswitch structure according to claim 1, further comprising a switch circuit board that is light-transmitting and disposed above the light-emitting die package, wherein the switch circuit board comprises a permeable carrying plate structure and circuitry carried on the permeable carrying plate structure, and the switch circuit board and the light-emitting die package do not overlap in the vertical direction.

7. The illuminated keyswitch structure according to claim 1, further comprising a switch circuit board that is light-transmitting and disposed above the light-emitting die package, wherein the switch circuit board comprises a switch contact pad, the switch contact pad has a flat edge, and the two adjacent light-emitting dies are arranged adjacent to and parallel to the flat edge.

8. The illuminated keyswitch structure according to claim 1, further comprising a first support and a second support which are pivotally connected with each other, wherein each of the two adjacent light-emitting dies does not overlap with a gap projection of the first support and the second support in the vertical direction.

9. The illuminated keyswitch structure according to claim 1, further comprising a switch circuit board, wherein the switch circuit board and the base plate are stacked, the switch circuit board is disposed above the light-emitting die package, the base plate a through hole, the switch circuit board comprises a switch contact pad, and vertical projections of the switch contact pad and the light-emitting die package on the base plate fall within the through hole.

10. The illuminated keyswitch structure according to claim 9, wherein the through hole comprises a main hole portion and an extension portion extending from a side of the main hole portion, the vertical projection of the switch contact pad on the base plate falls within the main hole portion, and the vertical projection of the light-emitting die package on the base plate falls within the extension portion.

11. The illuminated keyswitch structure according to claim 1, further comprising a switch circuit board that is light-transmitting, wherein the switch circuit board and the base plate are stacked, the switch circuit board is disposed above the light-emitting die package, the base plate has a through hole, the switch circuit board comprises a switch contact pad, a vertical projection of the light-emitting die package on the base plate falls within the through hole, and a vertical projection of the switch contact pad on the base plate is located outside the through hole.

12. The illuminated keyswitch structure according to claim 1, further comprising a switch circuit board that is light-transmitting, wherein the switch circuit board and the base plate are stacked, the switch circuit board is disposed above the light-emitting die package, the switch circuit board a trace segment extending straight, and the two adjacent light-emitting dies are arranged adjacent to and parallel to the trace segment.

13. The illuminated keyswitch structure according to claim 1, wherein the keycap has a permeable indicator area, the permeable indicator area has a lengthwise direction perpendicular to the arrangement direction of the light-emitting die package, the permeable indicator area comprises a plurality of permeable characters arranged along the lengthwise direction, and the permeable indicator area and the light-emitting die package at least partially overlap in the arrangement direction.

14. The illuminated keyswitch structure according to claim 1, wherein the keycap has a permeable indicator area, the permeable indicator area has a lengthwise direction, and the two adjacent light-emitting dies have edges perpendicular to the lengthwise direction.

15. The illuminated keyswitch structure according to claim 1, further comprising a light-guiding sheet that is disposed under the base plate, wherein the light-guiding sheet has an accommodating recess, the light-emitting die package is located in the accommodating recess, and light emitted by the light-emitting die package enters the light-guiding sheet from an inner wall surface of the accommodating recess.

16. The illuminated keyswitch structure according to claim 1, further comprising a mask layer that is disposed directly above the light-emitting die package and covers the light-emitting die package.

17. The illuminated keyswitch structure according to claim 1, further comprising a mask layer that covers the light-emitting die package, wherein the mask layer has at least one permeable area disposed on a periphery of a projection of the light-emitting die package on the mask layer.

18. The illuminated keyswitch structure according to claim 17, wherein the base plate has a through hole, and a vertical projection of the permeable area on the base plate falls within the through hole.

19. The illuminated keyswitch structure according to claim 17, wherein the base plate has a through hole, and a vertical projection of an impermeable area of the mask layer on the base plate at least partially falls within the through hole.

20. The illuminated keyswitch structure according to claim 1, wherein the base plate has a through hole, the through hole has a straight hole edge, the adjacent long sides of the two light-emitting dies are arranged in parallel to the straight hole edge.

\* \* \* \* \*